United States Patent
Takayama

(10) Patent No.: US 10,716,198 B2
(45) Date of Patent: Jul. 14, 2020

(54) EXTREME ULTRAVIOLET LIGHT GENERATION APPARATUS

(71) Applicant: Gigaphoton Inc., Tochigi (JP)

(72) Inventor: Akihiro Takayama, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/452,906

(22) Filed: Jun. 26, 2019

(65) Prior Publication Data

US 2019/0320521 A1    Oct. 17, 2019

Related U.S. Application Data

(63) Continuation of application No. PCT/JP2017/005851, filed on Feb. 17, 2017.

(51) Int. Cl.
| | | |
|---|---|---|
| *H05G 2/00* | (2006.01) | |
| *G03F 7/20* | (2006.01) | |
| *G21K 5/10* | (2006.01) | |
| *H01S 3/02* | (2006.01) | |

(52) U.S. Cl.
CPC .............. *H05G 2/008* (2013.01); *G03F 7/20* (2013.01); *G03F 7/70033* (2013.01); *G21K 5/10* (2013.01); *H01S 3/02* (2013.01); *H05G 2/003* (2013.01)

(58) Field of Classification Search
CPC .......... H05G 2/008; H05G 2/003; G03F 7/20; G03F 7/70033; G21K 5/10; H01S 3/02
USPC .......................................... 250/493.1, 504 R
See application file for complete search history.

(56) References Cited

U.S. PATENT DOCUMENTS

| | | | |
|---|---|---|---|
| 2001/0019401 A1* | 9/2001 | Irie | G03F 7/707 355/53 |
| 2003/0224262 A1* | 12/2003 | Lof | G03F 9/7011 430/22 |
| 2005/0184248 A1 | 8/2005 | Kanazawa et al. | |

(Continued)

FOREIGN PATENT DOCUMENTS

| | | |
|---|---|---|
| JP | H10-261662 A | 9/1998 |
| JP | 2005-233828 A | 9/2005 |

(Continued)

OTHER PUBLICATIONS

International Search Report issued in PCT/JP2017/005851; dated May 16, 2017.

(Continued)

*Primary Examiner* — Nicole M Ippolito
(74) *Attorney, Agent, or Firm* — Studebaker & Brackett PC

(57) ABSTRACT

An extreme ultraviolet light generation apparatus includes: a chamber; an optical unit; a chamber reference member including a housing space in which the optical unit is housed; a height positioning mechanism configured to position, at a predetermined installation position in the housing space, the optical unit to a predetermined installation height while contacting a first part of the optical unit; and a movement mechanism configured to linearly move the optical unit in the horizontal direction in the housing space while keeping the optical unit at a guide height, and including a guide member and a retraction part, wherein the guide height of the optical unit while being guided to move toward the installation position by the guide surface is substantially equal to the installation height.

17 Claims, 32 Drawing Sheets

(56) References Cited

U.S. PATENT DOCUMENTS

| | | | |
|---|---|---|---|
| 2008/0088843 A1* | 4/2008 | Shibazaki | G03F 9/7003 |
| | | | 356/399 |
| 2010/0051832 A1 | 3/2010 | Nishisaka et al. | |
| 2010/0193711 A1 | 8/2010 | Watanabe et al. | |
| 2012/0050707 A1* | 3/2012 | Levesque | G02B 5/085 |
| | | | 355/55 |
| 2016/0248213 A1 | 8/2016 | Kawasuji | |
| 2018/0034228 A1 | 2/2018 | Funaoka et al. | |
| 2019/0219609 A1* | 7/2019 | Alekseev | G01Q 230/20 |

FOREIGN PATENT DOCUMENTS

| | | |
|---|---|---|
| JP | 2010-080941 A | 4/2010 |
| JP | 2011-029587 A | 2/2011 |
| JP | 2013-048202 A | 3/2013 |
| JP | 2013-175431 A | 9/2013 |
| WO | 2012/132675 A1 | 10/2012 |
| WO | 2013/110968 A1 | 8/2013 |
| WO | 2015/075838 A1 | 5/2015 |
| WO | 2016/171158 A1 | 10/2016 |

OTHER PUBLICATIONS

International Preliminary Report on Patentability and Written Opinion Issued in PCT/JP2017/005851; dated Aug. 20, 2019.

\* cited by examiner

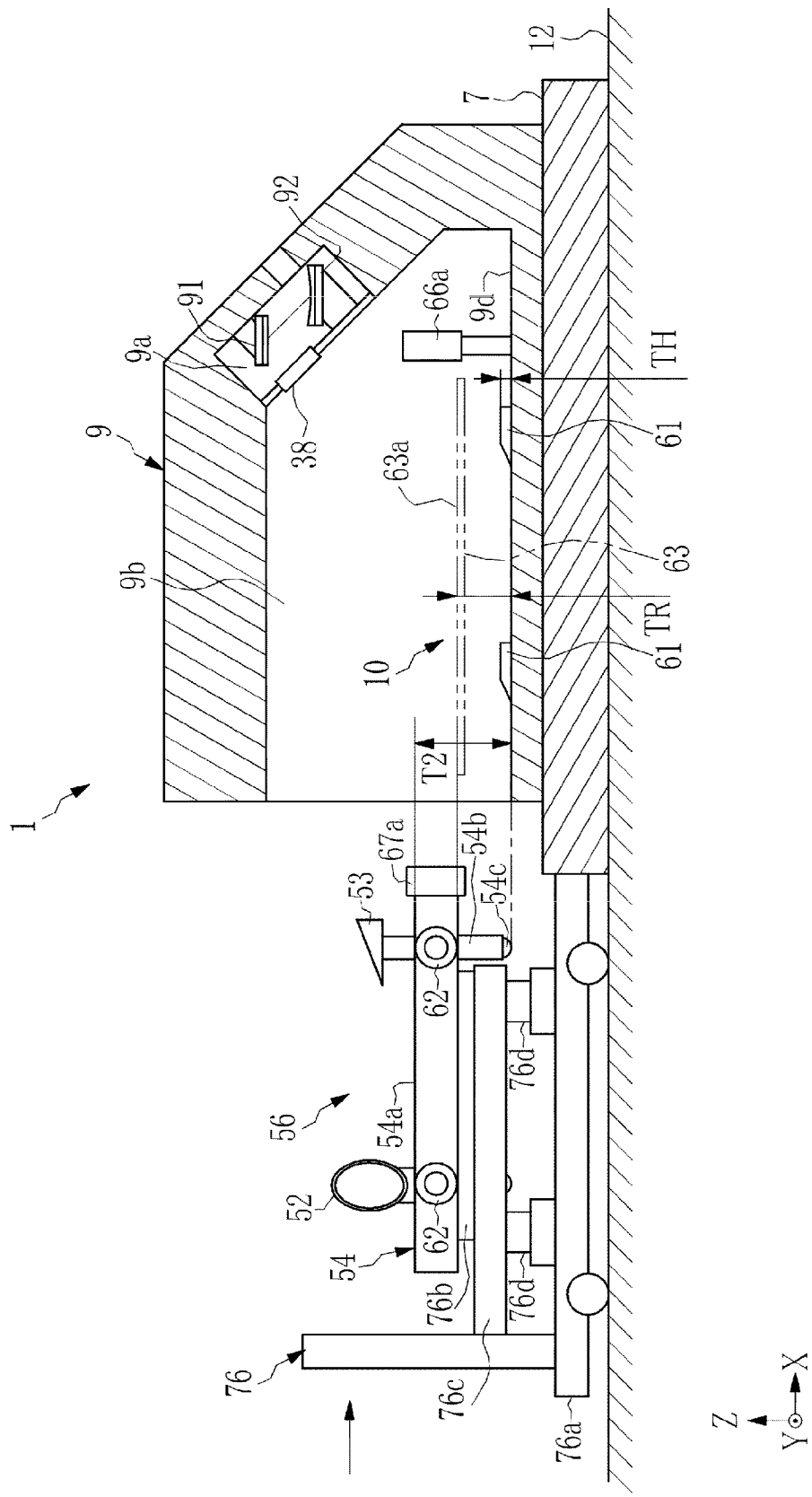

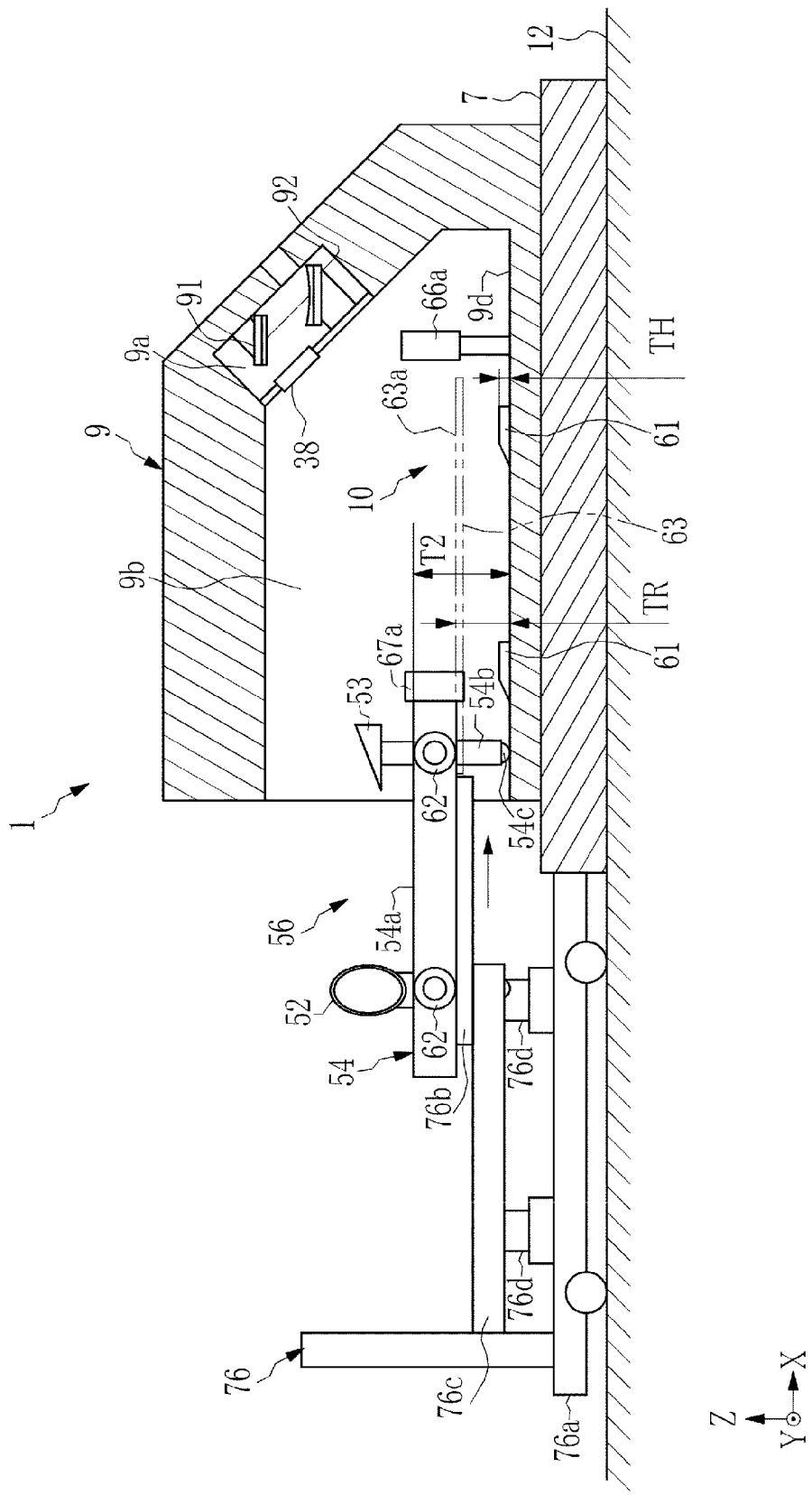

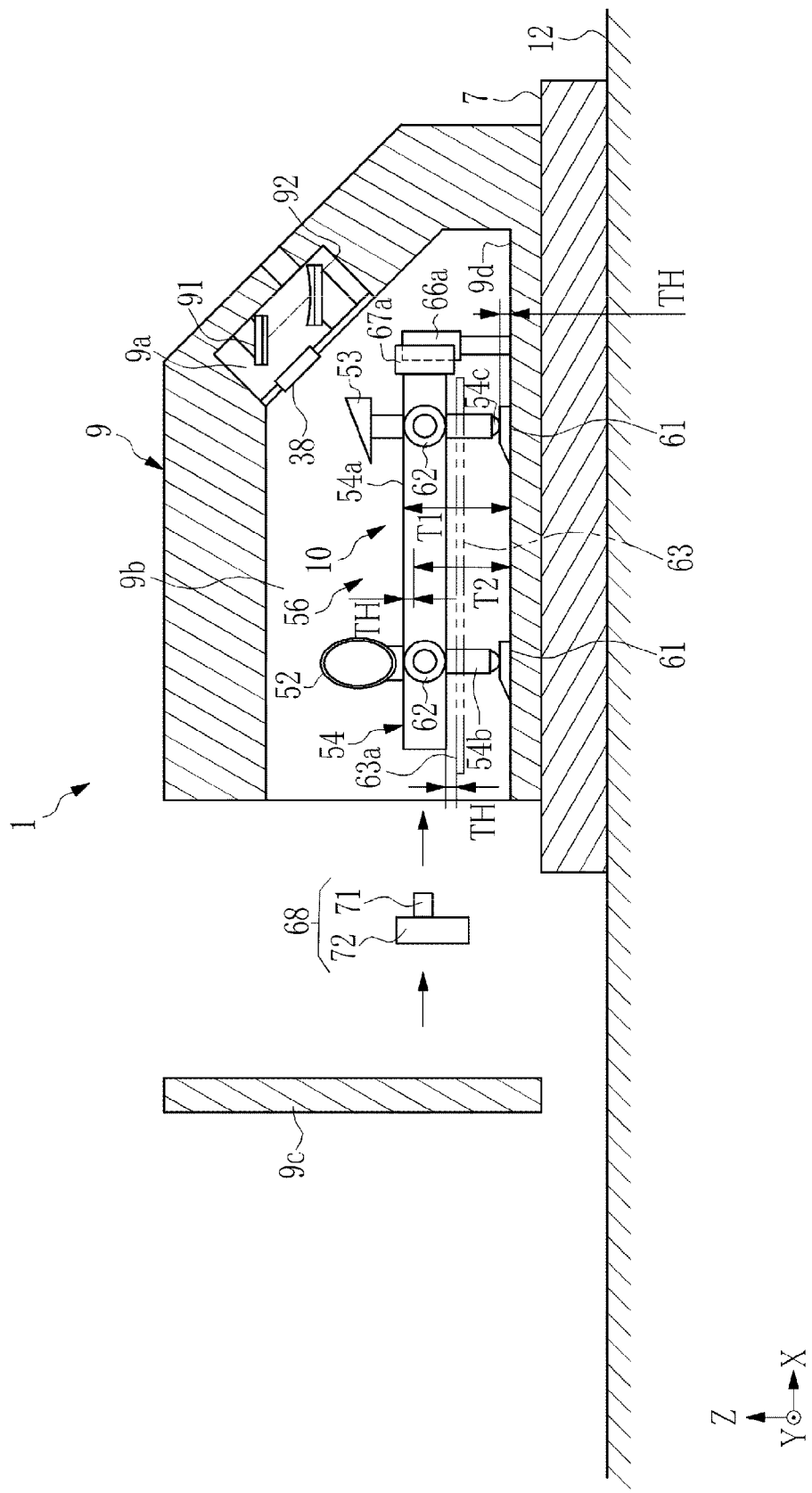

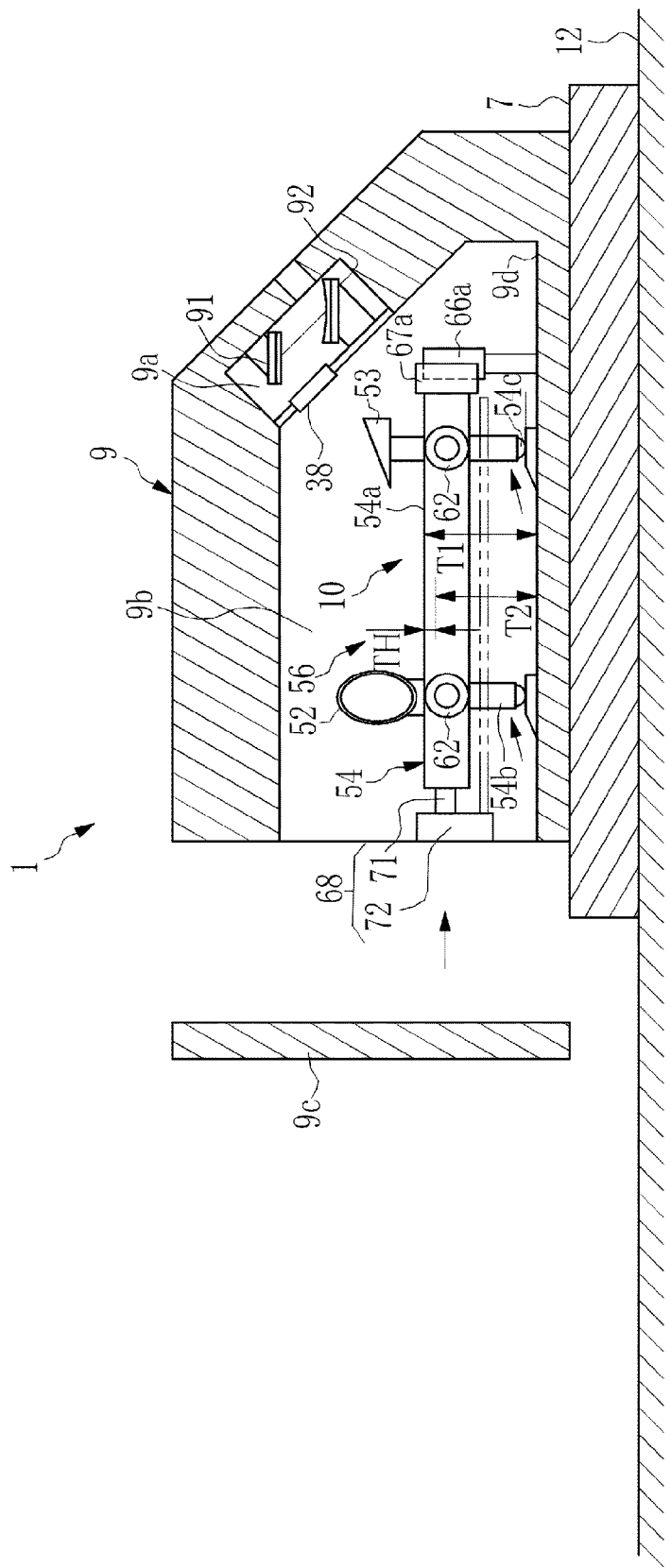

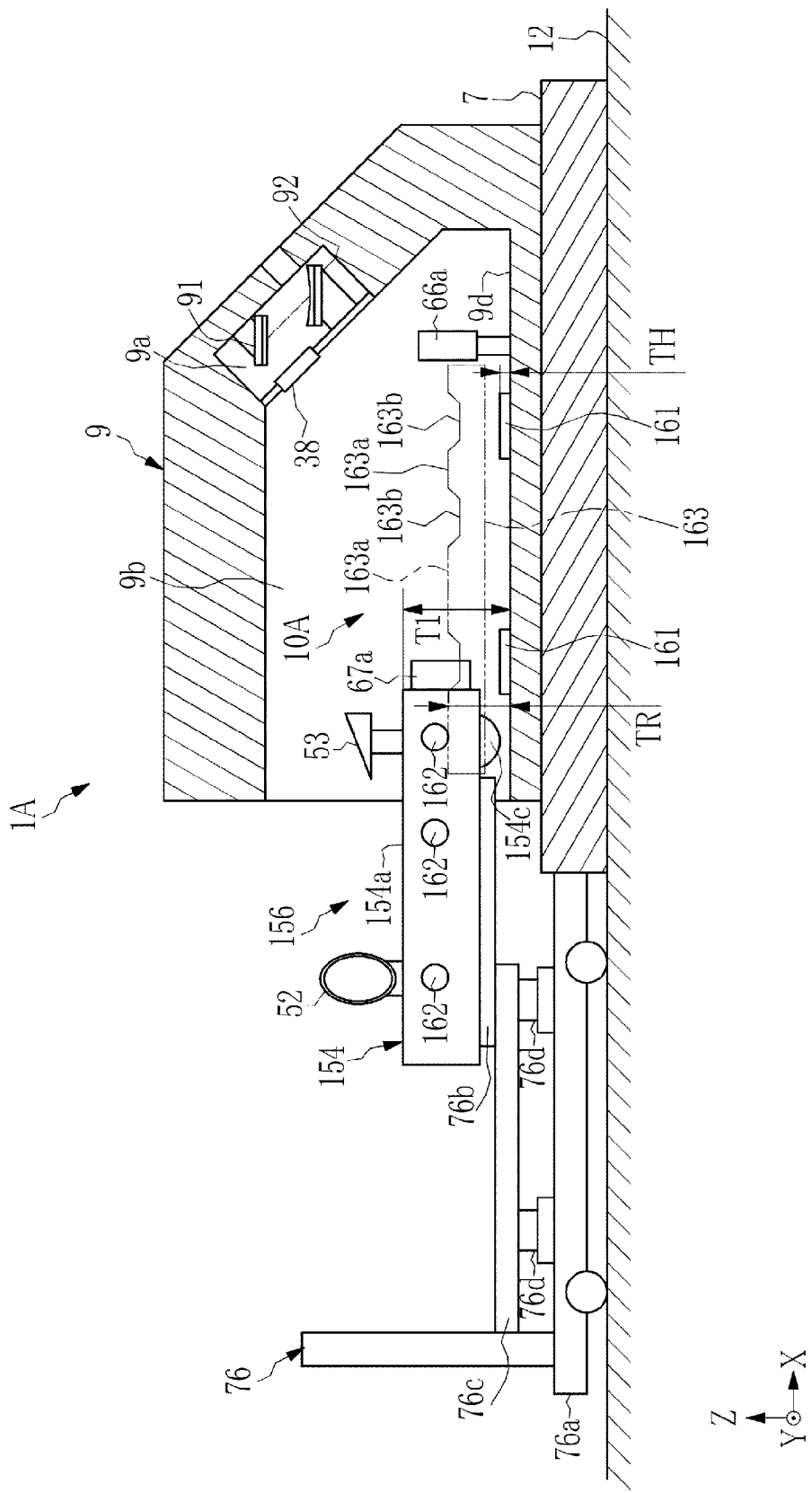

EXTREME ULTRAVIOLET LIGHT GENERATION APPARATUS

CROSS-REFERENCE TO RELATED APPLICATIONS

The present application is a continuation application of International Application No. PCT/JP2017/005851 filed on Feb. 17, 2017. The content of the application is incorporated herein by reference in its entirety.

BACKGROUND

1. Technical Field

The present disclosure relates to an extreme ultraviolet light generation apparatus.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, for example, it is desired to develop an exposure device including an extreme ultraviolet light generation device configured to generate extreme ultraviolet (EUV) light at a wavelength of 13 nm approximately in combination with reduced projection reflective optics.

Disclosed EUV light generation devices include the three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2013-175431
Patent Document 2: Japanese Unexamined Patent Application Publication No. 10-261662

SUMMARY

An extreme ultraviolet light source device according to one aspect of the present disclosure includes:

A. a chamber in which extreme ultraviolet light is generated by a target substance being irradiated with a laser beam to generate plasma from the target substance;
B. an optical unit including a laser beam introduction optical system for introducing the laser beam into the chamber;
C. a chamber reference member supporting the chamber and including a housing space in which the optical unit is housed;
D. a height positioning mechanism configured to position, at a predetermined installation position in the housing space, the optical unit to a predetermined installation height while contacting a first part of the optical unit; and
E. a movement mechanism configured to linearly move the optical unit in the horizontal direction in the housing space while keeping the optical unit at a guide height, and including a guide member provided with a guide surface that guides the optical unit to the installation position while contacting a second part of the optical unit, and a retraction part that is provided to the guide member and to which the second part is retracted from the guide surface when the optical unit reaches the installation position, the guide height of the optical unit while being guided to move toward the installation position by the guide surface being substantially equal to the installation height.

BRIEF DESCRIPTION OF THE DRAWINGS

Embodiments of the present disclosure will be described below as examples with reference to the accompanying drawings.

FIG. 7A is an explanatory diagram of a state in which a truck on which the optical unit according to the comparative example is mounted is moved close to the chamber reference member.

FIG. 7B is an explanatory diagram illustrating a first state halfway through conveyance of the optical unit illustrated in FIG. 7A into the chamber reference member.

FIG. 7E is an explanatory diagram illustrating a state in which the pressing unit is attached to the optical unit illustrated in FIG. 7A.

FIG. 7F is an explanatory diagram of a state in which the lid of the chamber reference member is attached after the state in FIG. 7E.

FIG. 11B is an explanatory diagram illustrating a first state halfway through conveyance of the optical unit illustrated in FIG. 11A into the chamber reference member.

DESCRIPTION OF EMBODIMENTS

<Contents>
1. Comparative example
  1.1 Overall description of extreme ultraviolet light generation system
    1.1.1 Configuration
    1.1.2 Operation
  1.2 Detailed description of EUV light generation apparatus
    1.2.1 Configuration
    1.2.2 Operation
  1.3 Description of attachment mechanism of laser beam introduction optical system
    1.3.1 Configuration
      1.3.1.1 Height positioning mechanism
      1.3.1.2 Movement mechanism
      1.3.1.3 Horizontal direction positioning mechanism
    1.3.2 Operation
  1.4 Problem
2. First Embodiment
  2.1 Description of attachment mechanism of laser beam introduction optical system of first embodiment
    2.1.1 Configuration
      2.1.1.1 Height positioning mechanism
      2.1.1.2 Movement mechanism
      2.1.1.3 Horizontal direction positioning mechanism
    2.1.2 Operation
  2.2 Modification of rail
3. Second Embodiment
  3.1 Description of attachment mechanism of laser beam introduction optical system of second embodiment
    3.1.1 Height positioning mechanism
    3.1.2 Movement mechanism
    3.1.3 Horizontal direction positioning mechanism
    3.1.4 Operation
4. Third Embodiment
  4.1 Configuration of horizontal direction positioning mechanism
  4.2 Operation Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

Figure 1:
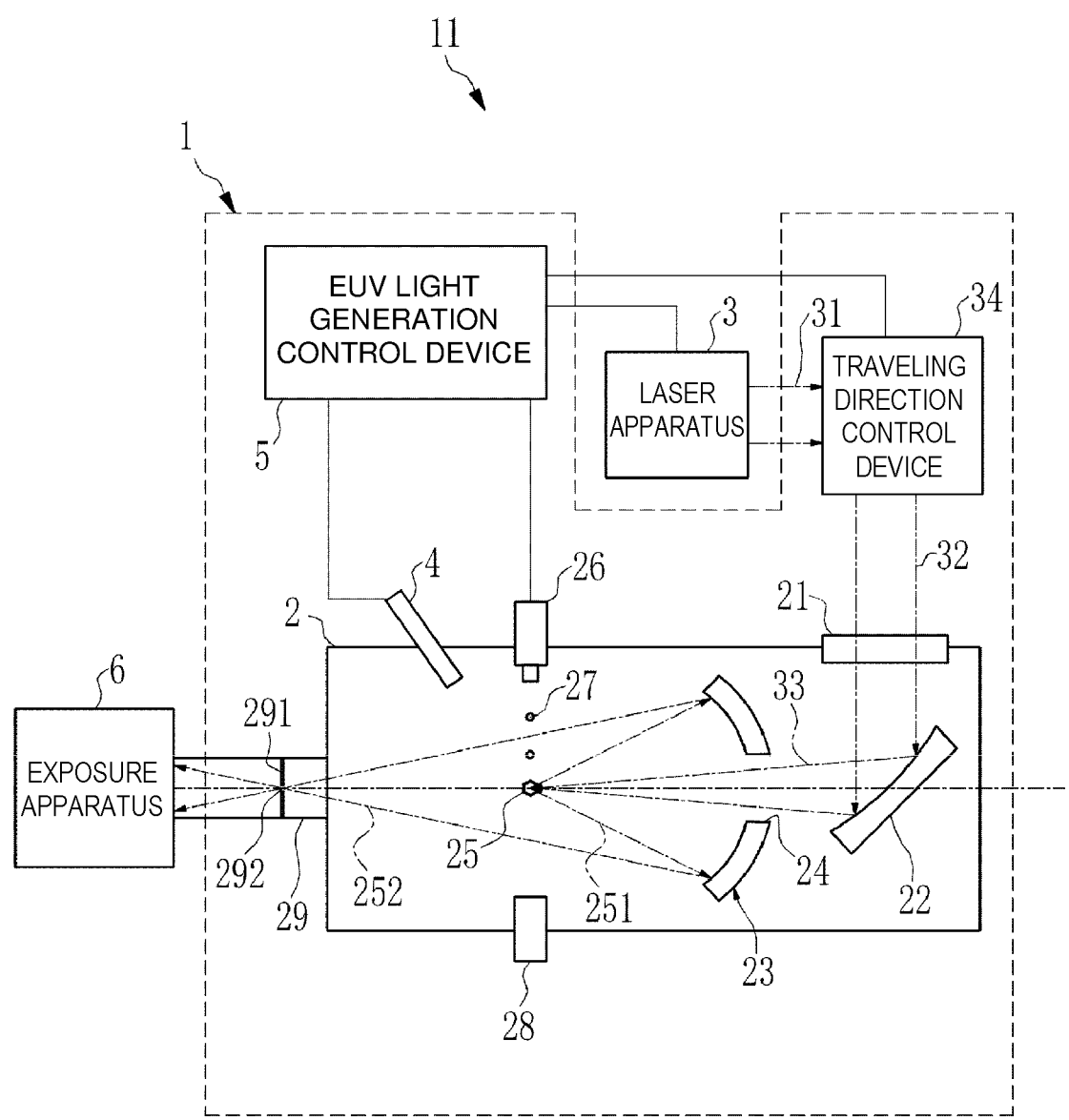
FIG. 1 schematically illustrates the configuration of an exemplary LPP EUV light generation system.

1. Comparative Example 1.1 Overall Description of Extreme Ultraviolet Light Generation System 1.1.1 Configuration FIG. 1 schematically illustrates the entire configuration of an extreme ultraviolet light generation system 11. Hereinafter, the extreme ultraviolet light generation system 11 is referred to as an EUV (extreme ultraviolet) light generation system. The EUV light generation system 11 includes an EUV light generation apparatus 1 as an extreme ultraviolet light generation apparatus, and a laser apparatus 3. The EUV light generation system 11 is used as a light source of an exposure apparatus 6. EUV light generated by the EUV light generation system 11 is input to the exposure apparatus 6.

The EUV light generation apparatus 1 employs a laser-produced plasma (LPP) scheme of generating EUV light by irradiating a target substance with a laser beam to excite the target substance. The EUV light generation apparatus 1 includes a chamber 2, a target supply device 26, and a laser beam traveling direction control device 34.

The chamber 2 is sealable. The target supply device 26 is attached, for example, through a wall of the chamber 2. The target supply device 26 uses, for example, melted tin (Sn) as the target substance. The material of the target substance is not limited to tin, but may contain terbium, gadolinium, lithium, xenon, or a combination of two or more of these materials. The target supply device 26 is disposed to output a target 27 toward a plasma generation region 25 in the chamber 2.

The laser beam traveling direction control device 34 includes an optical system for defining the traveling direction of a laser beam 31 output from the laser apparatus 3, and an actuator for adjusting the disposition, posture, or the like of the optical system. The laser beam traveling direction control device 34 outputs the laser beam 31, the traveling direction of which is controlled, to the chamber 2 as a laser beam 32.

The wall of the chamber 2 is provided with at least one through-hole. The through-hole is provided with a window 21 through which the laser beam 32 transmits. The chamber 2 includes a laser beam condensation mirror 22 and an EUV condensation mirror 23. The laser beam condensation mirror 22 reflects, toward the EUV condensation mirror 23, the laser beam 32 incident inside the chamber 2 through the window 21. The laser beam 32 reflected by the laser beam condensation mirror 22 travels toward the EUV condensation mirror 23 as a laser beam 33.

The EUV condensation mirror 23 has, for example, a spheroidal surface. The EUV condensation mirror 23 has first and second focal points. A multi-layer reflective film in which, for example, molybdenum and silicon are alternately stacked is formed on a surface of the EUV condensation mirror 23. The EUV condensation mirror 23 is disposed so that, for example, the first focal point is positioned in the plasma generation region 25 and the second focal point is positioned at an intermediate focus point (IF) 292. In addition, a through-hole 24 through which the laser beam 33 reflected by the laser beam condensation mirror 22 passes is provided at a central part of the EUV condensation mirror 23.

The EUV light generation apparatus 1 further includes an EUV light generation control device 5 and a target sensor 4. The target sensor 4 has an image capturing function and detects the existence, trajectory, position, speed, and the like of a target. The chamber 2 further includes a target collection unit 28. The target collection unit 28 collects the target 27 output from the target supply device 26.

The EUV light generation control device 5 collectively controls the entire EUV light generation system 11. The EUV light generation control device 5 processes, for example, image data of the target 27 captured by the target sensor 4. The EUV light generation control device 5 controls the output timing of the target 27, the output direction of the target 27, and the like. In addition, the EUV light generation control device 5 controls the oscillation timing of the laser apparatus 3, the traveling direction of the laser beam 32, the condensation position of the laser beam 33, and the like. These various kinds of control are merely exemplary, and may include other control as necessary in the EUV light generation control device 5.

In addition, the EUV light generation apparatus 1 includes a connection unit 29 that provides communication between the inside of the chamber 2 and the inside of the exposure apparatus 6. The connection unit 29 includes a wall 291 through which an aperture is formed. The wall 291 is disposed so that the aperture is positioned at the intermediate focus point 292 corresponding to the second focal point of the EUV condensation mirror 23.

1.1.2 Operation

The following describes the operation of the EUV light generation apparatus 1 with reference to FIG. 1. The laser beam 31 output from the laser apparatus 3 passes through the laser beam traveling direction control device 34, and is incident in the chamber 2 through the window 21 as the laser beam 32. The laser beam 32 travels in the chamber 2 along at least one laser beam path, and is reflected by the laser beam condensation mirror 22 and incident on the at least one target 27 as the laser beam 33.

The target supply device 26 outputs the target 27 toward the plasma generation region 25 in the chamber 2. The target 27 is irradiated with at least one pulse included in the laser beam 33. Plasma is generated from the target 27 irradiated with the laser beam 33, and radiates radiation light 251. EUV light 252 included in the radiation light 251 is selectively reflected by the EUV condensation mirror 23. The EUV light 252 reflected by the EUV condensation mirror 23 is output to the exposure apparatus 6 through the intermediate focus point 292.

1.2 Detailed Description of EUV Light Generation Apparatus 1.2.1 Configuration

Figure 2:
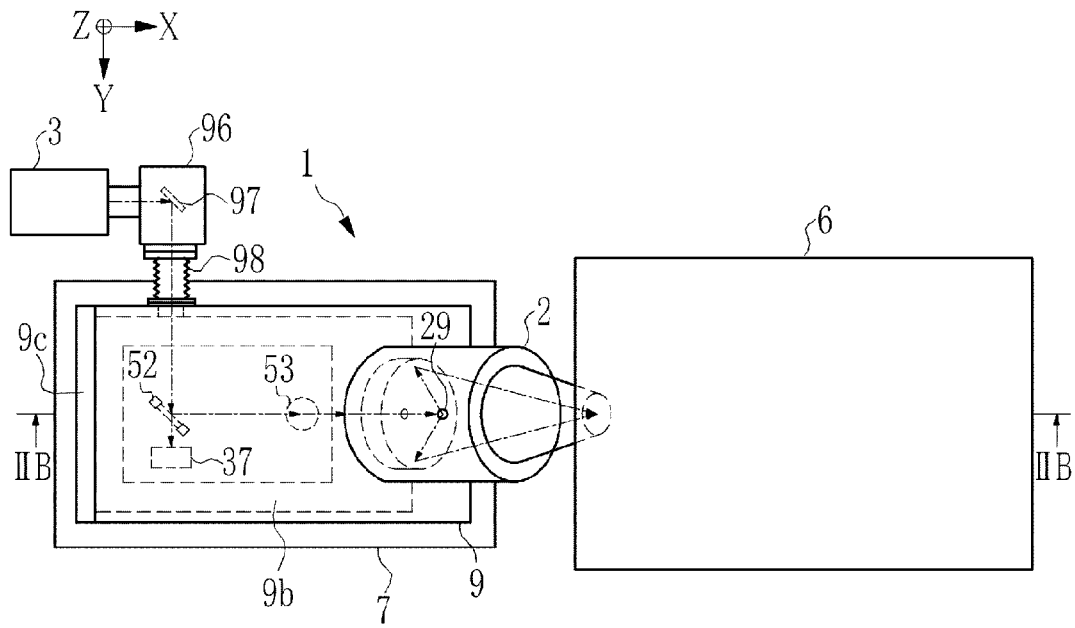
FIG. 2 is a plan view illustrating a state in which an EUV light generation apparatus is connected with an exposure apparatus.
Figure 3:
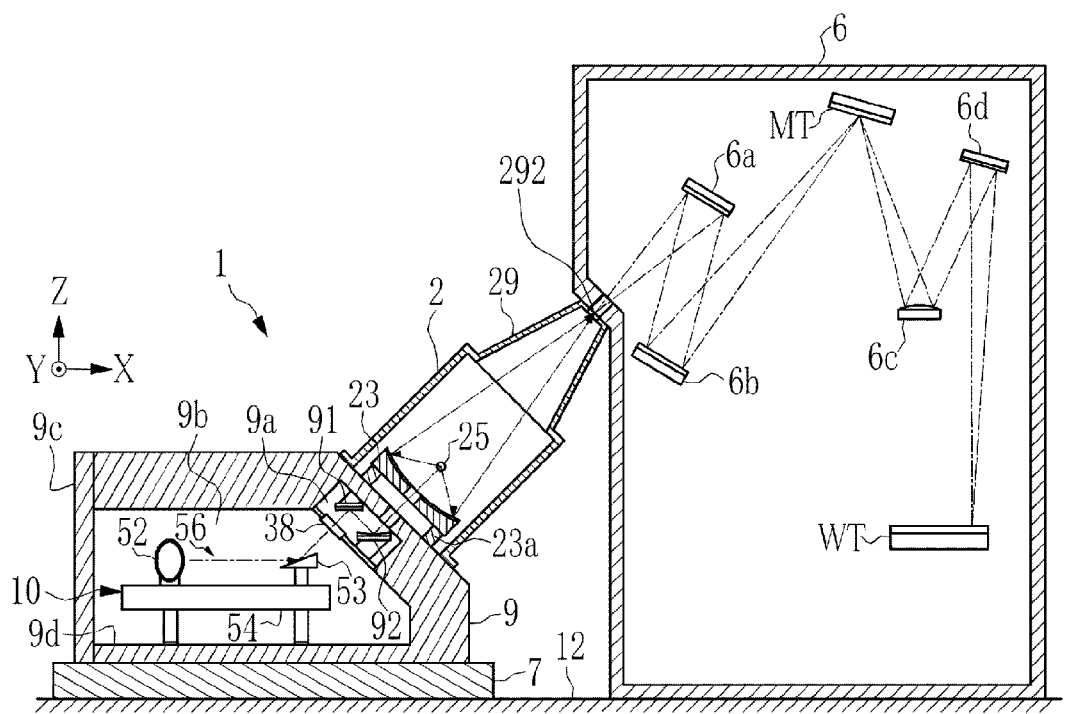
FIG. 3 is a cross-sectional view of the EUV light generation apparatus and the exposure apparatus taken along line IIB-IIB in FIG. 2.

FIG. 2 is a plan view illustrating a state in which the EUV light generation apparatus 1 is connected with the exposure apparatus 6. FIG. 3 is a cross-sectional view of the EUV light generation apparatus 1 and the exposure apparatus 6 illustrated in FIG. 2 taken along line IIB-IIB.

As illustrated in FIGS. 2 and 3, the EUV light generation apparatus 1 includes an installation mechanism 7, a chamber reference member 9, and the chamber 2. The EUV light generation apparatus 1, the exposure apparatus 6, and the like are installed on a floor surface 12 illustrated in FIG. 3. The installation mechanism 7 is installed on the floor surface 12. The installation mechanism 7 supports the chamber reference member 9, and the chamber reference member 9 supports the chamber 2. The chamber reference member 9 serves as a reference of the positional relation among various kinds of optical systems provided to the EUV light generation apparatus 1 as described later.

The installation mechanism 7 includes a mechanism configured to move the chamber reference member 9, and can move the chamber reference member 9 and the chamber 2 supported by the chamber reference member 9 relative to the exposure apparatus 6. The installation mechanism 7 includes a mechanism configured to position the chamber reference member 9. The chamber reference member 9 is positioned relative to the exposure apparatus 6 by the installation mechanism 7.

The chamber 2 has a substantially cylindrical shape, and is mounted and fixed on the chamber reference member 9 so that an opening of the chamber 2 having the substantially cylindrical shape at one end in the axial direction is blocked by one surface of the chamber reference member 9. As illustrated in FIG. 3, for example, the chamber reference member 9 has a tilted surface relative to a horizontal plane parallel to the floor surface 12, and the chamber 2 is fixed to the tilted surface. The axial direction of the chamber 2 is a direction along a virtual axis connecting the plasma generation region 25 and the intermediate focus point 292. The other end, in the axial direction, of the chamber 2 having the substantially cylindrical shape is connected with the connection unit 29.

Although not illustrated in FIG. 3, the target supply device 26 is attached to the chamber 2 as illustrated in FIG. 1. The target supply device 26 is fixed to the chamber 2 and supplies a target to the plasma generation region 25.

In the chamber 2, the EUV condensation mirror 23 is fixed to the chamber reference member 9 through, for example, an EUV condensation mirror holder 23a. Since the EUV condensation mirror 23 is fixed to the chamber reference member 9, the accuracy of positioning the position, the posture, and the like of the EUV condensation mirror 23 relative to the chamber reference member 9 is increased, and variation in the position, the posture, and the like of the EUV condensation mirror 23 is reduced. For example, the chamber reference member 9 is pressed against a stopper (not illustrated) to accurately adjust the position of the chamber reference member 9 relative to the exposure apparatus 6, thereby accurately adjusting the position of the EUV condensation mirror 23 relative to the exposure apparatus 6.

The chamber reference member 9 includes, for example, a housing space 9a communicated with the inside of the chamber 2 through a through-hole, and a housing space 9b adjacent to the housing space 9a. A window 38 is provided between the housing space 9a and the housing space 9b. Accordingly, the pressure in the chamber 2 is maintained at low pressure, and gas is sealed in the chamber 2. The housing space 9b has an opening on the back side, to which a lid 9c is attached. The inside of the housing space 9b is sealable by the lid 9c.

A laser beam condensation optical system including a high reflectance mirror 91 and a laser beam condensation mirror 92 is disposed in the housing space 9a. A laser beam introduction optical system including a beam splitter 52 and a high reflectance mirror 53 is disposed in the housing space 9b. In addition, a laser beam measurement instrument 37 is disposed in the housing space 9b as illustrated in FIG. 2.

The laser beam condensation optical system including the high reflectance mirror 91 and the laser beam condensation mirror 92 is positioned and fixed to the chamber reference member 9 by holders of the mirrors. Accordingly, the accuracy of positioning the relative position, posture, and the like of the laser beam condensation optical system relative to the EUV condensation mirror 23 is increased, and variation in the position, the posture, and the like of the laser beam condensation optical system is reduced. Thus, a position at which a laser beam is condensed through the laser beam condensation optical system can be accurately set relative to the EUV condensation mirror 23. The laser beam condensation mirror 92 may be an off-axis parabolic mirror.

The laser beam introduction optical system including the beam splitter 52 and the high reflectance mirror 53 is positioned and fixed to the chamber reference member 9. Accordingly, the accuracy of positioning the position, posture, and the like of the laser beam introduction optical system relative to the laser beam condensation optical system is increased, and variation in the position, posture, and the like of the laser beam introduction optical system is reduced. Thus, for example, a position and an angle at which a laser beam is incident on the laser beam condensation optical system are accurately set.

In addition, the laser beam measurement instrument 37 is positioned and fixed to the chamber reference member 9. Accordingly, the accuracy of positioning the relative position, posture, and the like of the laser beam measurement instrument 37 relative to the laser beam introduction optical system is increased, and variation in the position, posture, and the like thereof is reduced. Thus, the sectional intensity profile, pointing, divergence, and the like of a laser beam supplied to the laser beam measurement instrument 37 through the laser beam introduction optical system can be accurately measured by the laser beam measurement instrument 37.

In FIG. 2, an optical path pipe 96 is attached to the chamber reference member 9 through a flexible pipe 98. The optical path pipe 96 is connected with the laser apparatus 3. A high reflectance mirror 97 is disposed in the optical path pipe 96.

As illustrated in FIG. 3, the exposure apparatus 6 includes a reflective optical system including a plurality of high reflectance mirrors 6a to 6d. A mask table MT and a workpiece table WT are installed in the exposure apparatus 6. For example, the exposure apparatus 6 irradiates a mask on the mask table MT with EUV light to project an image of the mask onto a workpiece (such as a semiconductor wafer) on the workpiece table WT. The mask table MT and the workpiece table WT are simultaneously moved in parallel to each other so that the pattern of the mask is transferred onto the workpiece.

1.2.2 Operation

As illustrated in FIG. 2, a laser beam output from the laser apparatus 3 is supplied toward the housing space 9b of the chamber reference member 9 through reflection at the high reflectance mirror 97.

The laser beam supplied into the housing space 9b is incident on the beam splitter 52 included in the laser beam introduction optical system. The beam splitter 52 reflects the incident laser beam toward the high reflectance mirror 53 at high reflectance, and transmits part of the incident laser beam toward the laser beam measurement instrument 37. The high reflectance mirror 53 reflects the laser beam reflected by the beam splitter 52 so that the laser beam is introduced into the housing space 9a through the window 38.

The laser beam introduced into the housing space 9a is incident on the high reflectance mirror 91 included in the laser beam condensation optical system. The high reflectance mirror 91 reflects the incident laser beam toward the laser beam condensation mirror 92. The laser beam condensation mirror 92 reflects the laser beam reflected by the high reflectance mirror 91 so that the laser beam condenses at the plasma generation region 25. A target supplied from the target supply device 26 (refer to FIG. 1) is irradiated with the laser beam at the plasma generation region 25 to generate plasma, thereby generating radiation light including EUV light. The EUV light is output to the exposure apparatus 6 through the intermediate focus point 292.

1.3 Description of Attachment Mechanism of Laser Beam Introduction Optical System 1.3.1 Configuration FIGS. 4A to 4C, 5A, and 5B are each an explanatory diagram of an attachment mechanism 10 configured to attach the laser beam introduction optical system to the chamber reference member 9. The laser beam introduction optical system including the beam splitter 52 and the high reflectance mirror 53 is fixed to an attachment mount 54. The attachment mount 54 is, for example, a table including a body part 54a and three leg parts 54b. The body part 54a is an attachment plate to which the beam splitter 52 and the high reflectance mirror 53 are attached. The beam splitter 52 and the high reflectance mirror 53 are attached and fixed to the body part 54a at predetermined positions on an upper surface.

The attachment of the beam splitter 52 and the high reflectance mirror 53 to the attachment mount 54 is performed outside of the chamber reference member 9. Then, an optical unit 56 as an integration of the beam splitter 52, the high reflectance mirror 53, and the attachment mount 54 to which the beam splitter 52 and the high reflectance mirror 53 are attached is conveyed into the chamber reference member 9 and positioned and fixed to a predetermined installation position in the chamber reference member 9.

For example, at maintenance, the optical unit 56 is removed from the chamber reference member 9 and then attached to the chamber reference member 9. The EUV light generation apparatus 1 includes the attachment mechanism 10 for attaching the optical unit 56 to the chamber reference member 9.

Figure 4A:
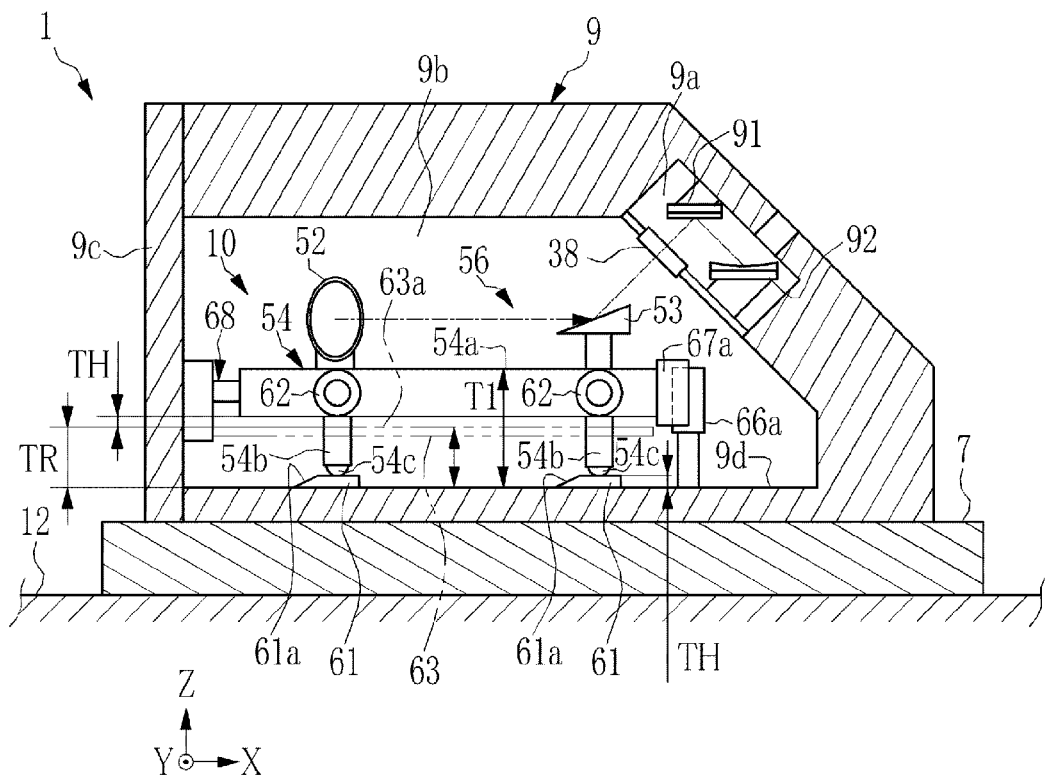
FIG. 4A is a side view of an optical unit attached to a chamber reference member according to a comparative example when viewed from side.
Figure 4B:
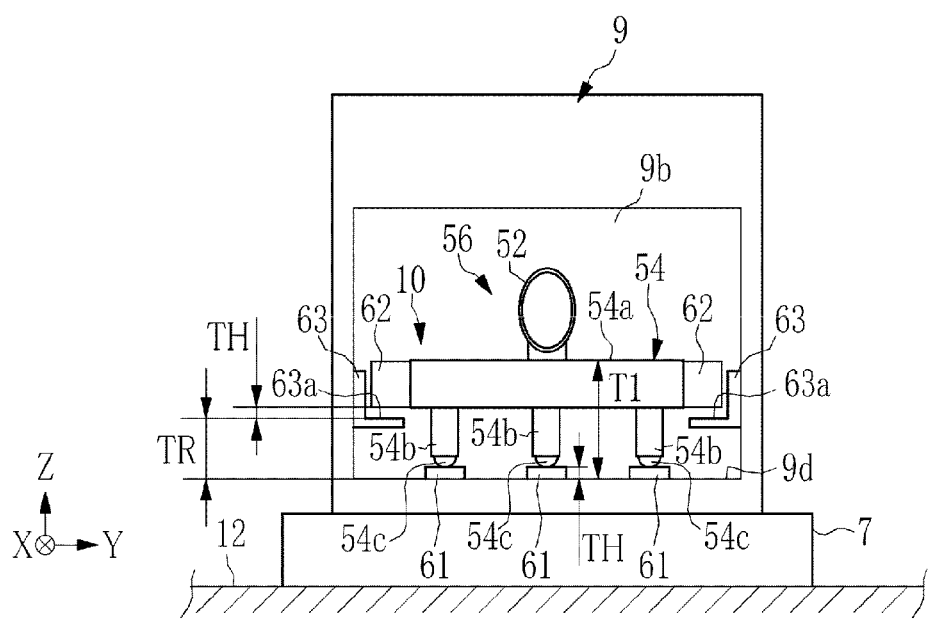
FIG. 4B is a back view of the optical unit illustrated in FIG. 4A when viewed from the back side of the chamber reference member from which a lid is removed.
Figure 4C:
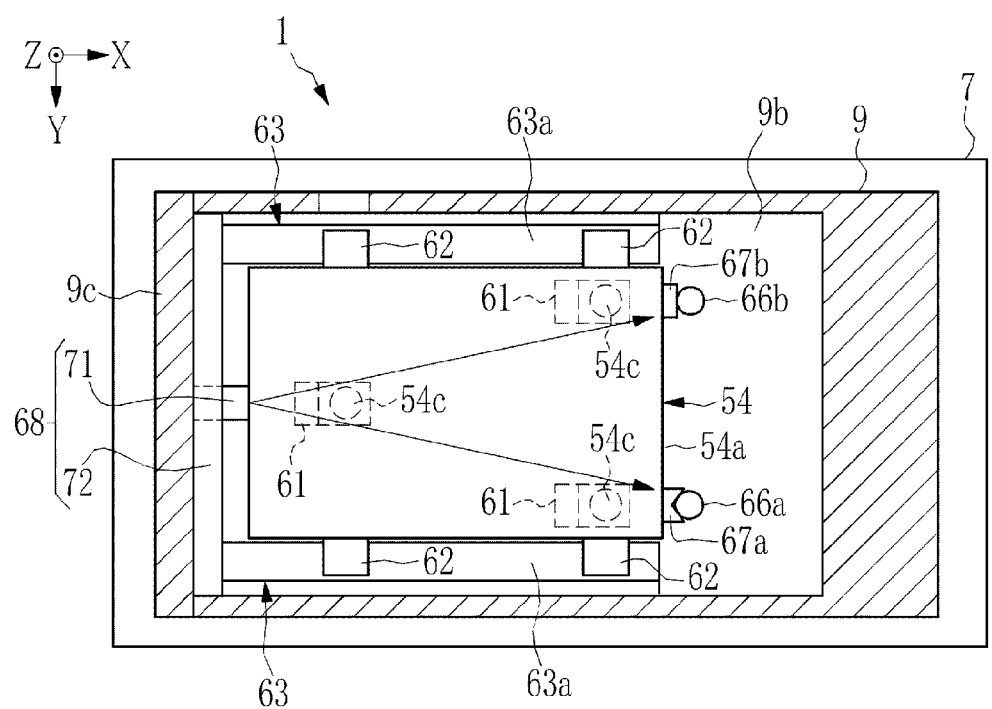
FIG. 4C is a plan view of the optical unit illustrated in FIG. 4A when viewed from above the chamber reference member.
Figure 5A:
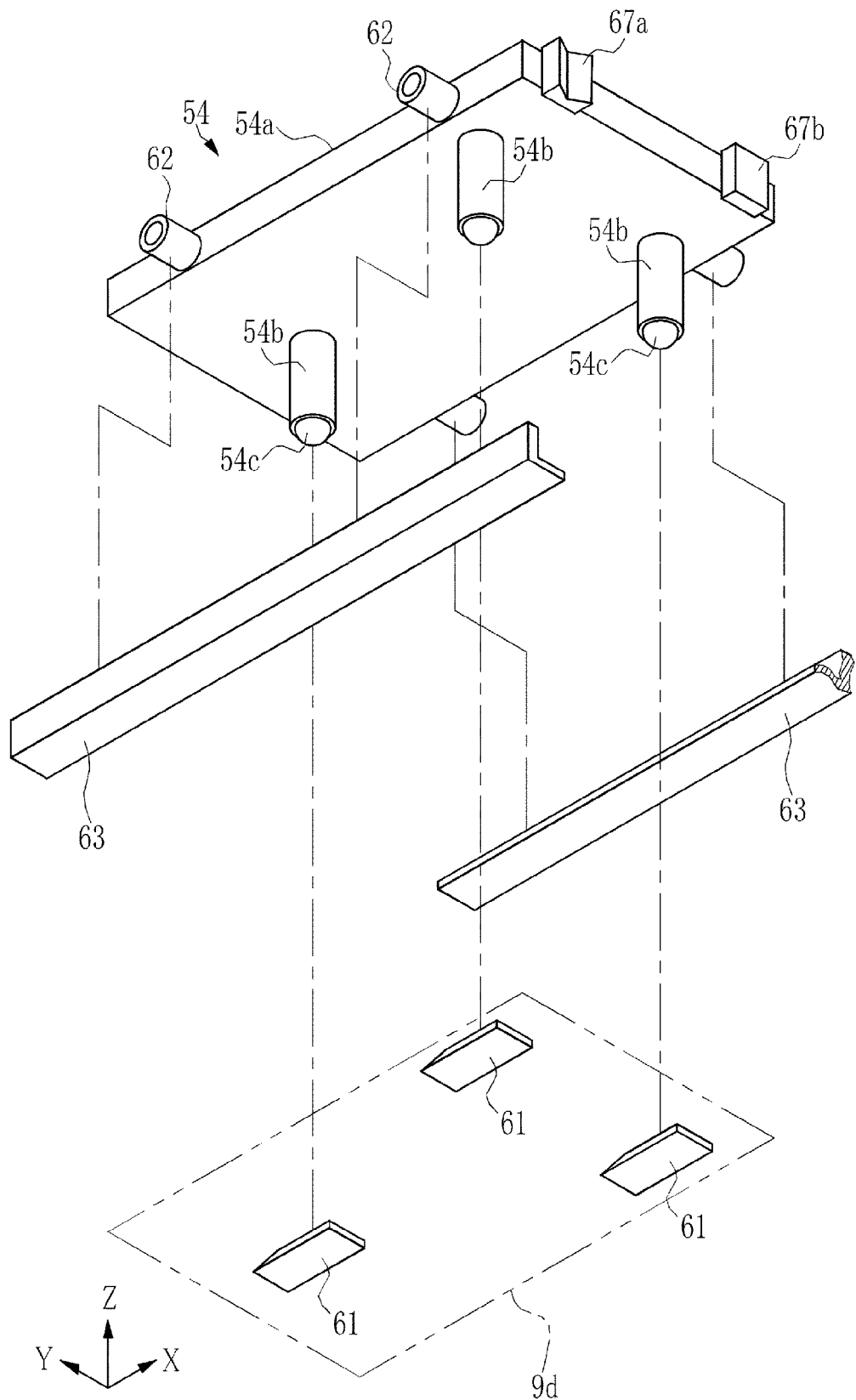
FIG. 5A is an exploded perspective view of part of the configuration of an attachment mechanism of the optical unit according to the comparative example when viewed obliquely from below.
Figure 5B:
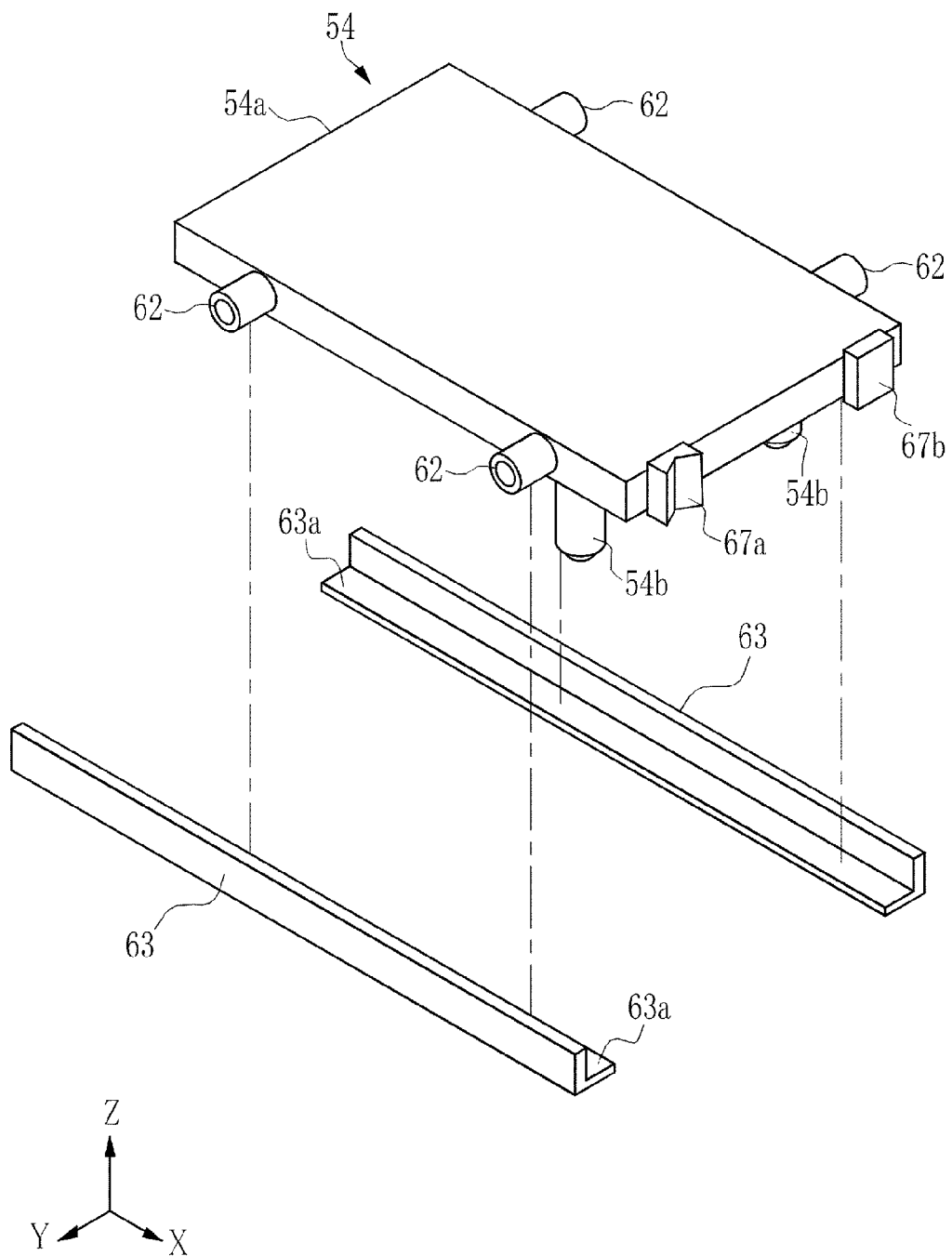
FIG. 5B is an exploded perspective view of part of the configuration in FIG. 5A when viewed obliquely from above.

FIGS. 4A to 4C are each an explanatory diagram of the attachment mechanism 10, and the optical unit 56 being positioned and fixed to the predetermined installation position in the housing space 9b of the chamber reference member 9. FIG. 4A is a side view of the optical unit 56 attached to the chamber reference member 9, and the attachment mechanism 10 when viewed from side of the chamber reference member 9. FIG. 4B is a back view of the optical unit 56 and the attachment mechanism 10 when viewed from the back side of the chamber reference member 9 from which the lid 9c is removed. FIG. 4C is a plan view of the optical unit 56 and the attachment mechanism 10 when viewed from above the chamber reference member 9. For simplification of description, FIG. 4C omits part of the chamber reference member 9. Hereinafter, part of some components is omitted as appropriate in illustration in some cases. FIGS. 5A and 5B are each an exploded perspective view illustrating the attachment mount 54 of the optical unit 56 and part of the configuration of the attachment mechanism 10. FIG. 5A is a perspective view when viewed from obliquely below, and FIG. 5B is a perspective view when viewed from obliquely above. FIGS. 4C, 5A, and 5B omit illustration of the beam splitter 52 and the high reflectance mirror 53 attached to the attachment mount 54 to avoid complication of the drawings.

An X direction is defined to be the front-back direction of the chamber reference member 9, a Y direction is defined to be the width direction of the chamber reference member 9, and a Z direction is defined to be the height direction of the chamber reference member 9. The X direction and the Y direction are collectively referred to as a horizontal direction. In the X direction, a side on which the lid 9c is attached is referred to as the back side of the chamber reference member 9, and a side on which the chamber 2 is attached is referred to as the front side of the chamber reference member 9.

The attachment mechanism 10 includes a movement mechanism and a positioning mechanism. The movement mechanism moves the optical unit 56 conveyed into the chamber reference member 9 to the predetermined installation position in the housing space 9b of the chamber reference member 9. The positioning mechanism positions the optical unit 56 at the installation position. The positioning mechanism includes a height positioning mechanism configured to perform positioning of the optical unit 56 in the height direction (Z direction), and a horizontal direction positioning mechanism configured to perform positioning of the optical unit 56 in the horizontal direction (X and Y directions). The height of the optical unit 56 from a bottom surface 9d of the chamber reference member 9 is adjusted by the height positioning mechanism.

1.3.1.1 Height Positioning Mechanism

As illustrated in FIGS. 4A to 4C and 5A, the bottom surface 9d is provided with a mount 61. The position of the mount 61 defines the installation position of the optical unit 56 in the housing space 9b. Accordingly, the leg parts 54b of the attachment mount 54 of the optical unit 56 are placed on the mount 61 at the installation position. As illustrated in FIGS. 4C and 5A, the three leg parts 54b are provided: for example, two on the front side of the body part 54a, and one on the back side thereof. The three mounts 61 are provided in a manner corresponding to the three leg parts 54b of the attachment mount 54, and the disposition interval of the mounts 61 corresponds to the disposition interval of the leg parts 54b.

As illustrated in FIGS. 4A and 4B, when the three leg parts 54b are placed on the respective mounts 61, the attachment mount 54, more specifically, the upper surface of the body part 54a is positioned to a height T1 from the bottom surface 9d. Accordingly, the leg parts 54b and the mounts 61 are included in the height positioning mechanism of the optical unit 56. The body part 54a is positioned to the predetermined height T1 when the mounts 61 each having a predetermined thickness TH are installed on the bottom surface 9d. Since the laser beam introduction optical system including the beam splitter 52 and the high reflectance mirror 53 is fixed to the attachment mount 54, the height of the laser beam introduction optical system is adjusted by positioning the height of the attachment mount 54. The height T1 is referred to as an installation height.

Each mount 61 is a flat plate provided with a slope 61a tilted toward the bottom surface 9d on one end on the back side of the chamber reference member 9 as illustrated in FIGS. 4A and 5A. The slope 61a is a slope for mounting the attachment mount 54 onto the upper surface of the mount 61 from the bottom surface 9d. To facilitate movement of the attachment mount 54, ball casters 54c as rotational bodies are provided at lower ends of the respective leg parts 54b of the attachment mount 54. The attachment mount 54 travels on the bottom surface 9d and the slope 61a of the mount 61 while the ball casters 54c rotate.

1.3.1.2 Movement Mechanism

As illustrated in FIGS. 4A to 4C, 5A, and 5B, the movement mechanism includes a wheel 62 as a rotational body and a rail 63. The two wheels 62 are provided to each of right and left side surfaces of the body part 54a of the attachment mount 54 on both sides in the width direction (Y direction) orthogonal to the moving direction (X direction). The two rails 63 are individually attached to right and left sidewalls inside the housing space 9b of the chamber reference member 9. The disposition interval of the right and left rails 63 in the width direction (Y direction) corresponds to the disposition interval of the right and left wheels 62 of the attachment mount 54. Each rail 63 is a guide member extending in the X direction as the moving direction in which the optical unit 56 is guided. The rail 63 has a guide surface 63a as an upper surface. The guide surface 63a is a travel surface on which the corresponding wheel 62 travels in contact, and guides the optical unit 56 to the installation position.

As illustrated in FIG. 4B, one end of the guide surface 63a of each rail 63 in the width direction vertically stands, and the rail 63 has an L sectional shape on a YZ plane. The rail 63 is attached while the part standing from the guide surface 63a is in contact with a sidewall of the housing space 9b.

As illustrated in FIGS. 4A and 4B, a height TR of the guide surface 63a of each rail 63 from the bottom surface 9d is equal to the height from the bottom surface 9d to a lower end of the corresponding wheel 62 when the attachment mount 54 is directly placed on the bottom surface 9d. The state in which the attachment mount 54 is directly placed on the bottom surface 9d corresponds to the state in which the leg parts 54b of the attachment mount 54 is not placed on the mounts 61 on the bottom surface 9d.

When the leg parts 54b of the attachment mount 54 are placed on the mounts 61, the height of each wheel 62 increases by the thickness TH of the mount 61, and accordingly, the height of the optical unit 56 increases. In this state, as illustrated in FIGS. 4A and 4B, the guide surface 63a of each rail 63 and the lower end of the wheel 62 are separated from each other, and a gap corresponding to the thickness TH is generated therebetween.

When the optical unit 56 is conveyed into the housing space 9b of the chamber reference member 9, the rails 63 contact the wheels 62 on both sides of the attachment mount 54 in the state in which the leg parts 54b of the attachment mount 54 are not placed on the mounts 61. Since the disposition interval of the right and left rails 63 corresponds to the disposition interval of the right and left wheels 62, the traveling path of the wheels 62 is regulated by the rails 63 in the width direction. In this manner, the traveling path of each wheel 62 is regulated by the guide surface 63a of the corresponding rail 63 when the leg parts 54b are not placed on the mounts 61. Accordingly, the optical unit 56 travels straight in the X direction and is guided toward the installation position.

1.3.1.3 Horizontal Direction Positioning Mechanism

As illustrated in FIGS. 4C, 5A, and 5B, the horizontal direction positioning mechanism includes abutment pins 66a and 66b, a V-shaped block 67a, a flat block 67b, and a pressing unit 68. The abutment pins 66a and 66b are provided in the housing space 9b and disposed at predetermined positions on the bottom surface 9d. The abutment pins 66a and 66b regulate movement of the optical unit 56 in the X direction when contacting a front end part of the attachment mount 54. The front end part of the attachment mount 54 corresponds to a first end part in the X direction as the moving direction.

The V-shaped block 67a and the flat block 67b are provided to the body part 54a of the front end part of the attachment mount 54. The disposition interval of the V-shaped block 67a and the flat block 67b in the width direction of the body part 54a corresponds to the disposition interval of the abutment pins 66a and 66b. The V-shaped block 67a and the flat block 67b are disposed at positions where the V-shaped block 67a contacts the abutment pin 66a and the flat block 67b contacts the abutment pin 66b.

The abutment pins 66a and 66b each have a circular horizontal sectional shape as a sectional shape on an XY plane. A contact part of the V-shaped block 67a with the abutment pin 66a has a V groove shape having a V-shaped horizontal sectional shape with a central part recessed toward the back side. A contact part of the flat block 67b with the abutment pin 66b has a plane shape.

When the optical unit 56 is pressed toward the front side at the installation position on the mounts 61, the V-shaped block 67a and the flat block 67b contact the respective abutment pins 66a and 66b, thereby regulating movement of the optical unit 56 toward the front side in the X direction. In addition, movement of the optical unit 56 in the Y direction is regulated when the abutment pin 66a having a circular section enters into the V groove of the V-shaped block 67a up to an appropriate position at which two points of the abutment pin 66a on the circumference contact the V groove.

As illustrated in FIG. 4C, the pressing unit 68 includes a pressing portion 71 and an attachment base 72. The pressing portion 71 presses the attachment mount 54 against the abutment pins 66a and 66b from a rear end part of the attachment mount 54. The rear end part of the attachment mount 54 corresponds to a second end part opposite to the first end part in the X direction.

The attachment base 72 is a narrow plate member, the longitudinal direction of which extends in the width direction (Y direction) of the chamber reference member 9. The attachment base 72 has such a length that both ends thereof reach rear ends of the rails 63, and both ends are fixed to the rear ends of the rails 63 by, for example, bolts (not illustrated). The pressing portion 71 is substantially attached to the center of the attachment base 72 in the longitudinal direction (Y direction) so that the pressing portion 71 contacts the center of the attachment mount 54 in the width direction.

Figure 6:
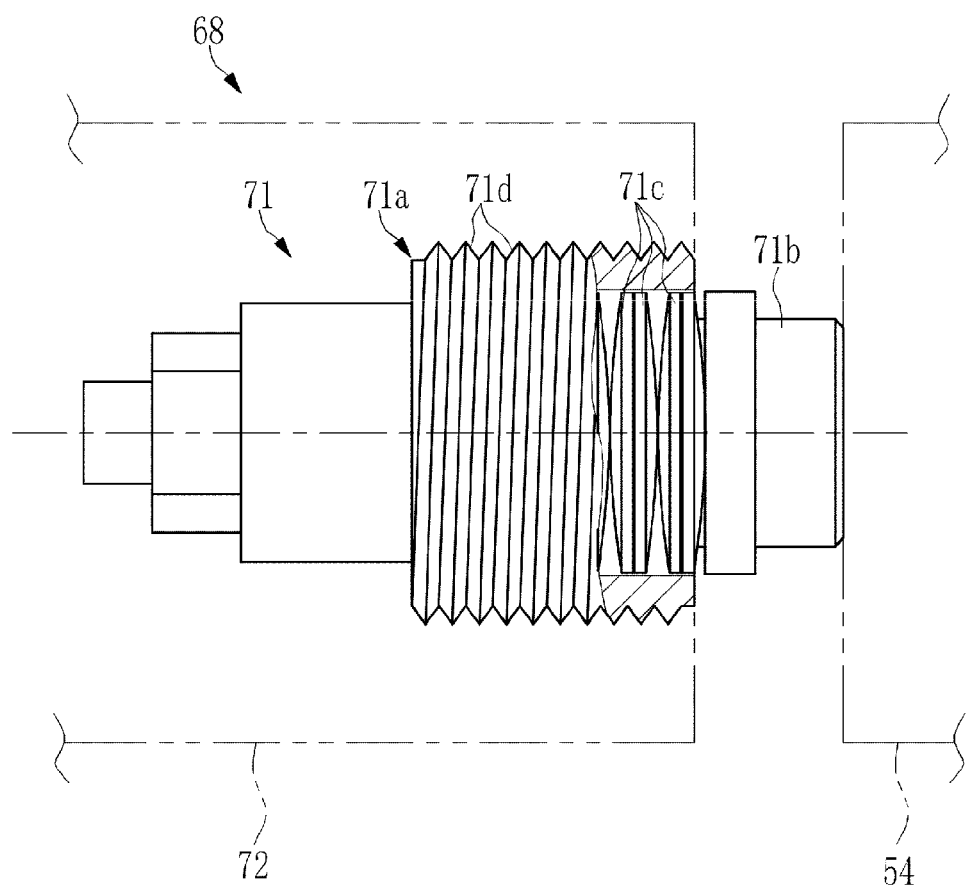
FIG. 6 is an explanatory diagram of a pressing unit according to the comparative example.

FIG. 6 is an explanatory diagram illustrating the pressing unit 68 and the attachment mount 54 pressed by the pressing unit 68 when viewed from side. The pressing portion 71 includes a housing 71a as a body part, a head part 71b, and a disc spring 71c. The head part 71b is a movable portion attached to freely move relative to the housing 71a in the front-back direction (X direction), and contacts the rear end part of the attachment mount 54. The disc spring 71c is housed in the housing 71a, and applies pushing force due to elasticity of the spring toward the front side relative to the head part 71b. The pushing force is applied to the attachment mount 54 through the head part 71b so that the attachment mount 54 is pressed against the abutment pins 66a and 66b.

A male screw 71d is formed on the outer periphery of the housing 71a. The pressing portion 71 is attached so that its part from the rear end to the housing 71a is embedded in the attachment base 72 and its front end part thereof including the head part 71b protrudes from a front end of the attachment base 72. A female screw (not illustrated) that engages with the male screw 71d of the housing 71a is formed on the inner peripheral surface of a housing part of the attachment base 72 in which the housing 71a is housed. Accordingly, the amount of protrusion of the housing 71a of the pressing portion 71 toward the front side is adjusted by rotating the pressing portion 71 about the axis relative to the attachment base 72.

As publicly known, the disc spring 71c has a disk shape including a convex surface on one side and a concave surface on the other side. When elastically deformed so that the convex surface dents, the disc spring 71c generates reaction force based on elasticity as pushing force. The disc spring 71c generates large reaction force from small deflection as compared to a coil spring or the like. Thus, space saving is possible.

A shaft hole (not illustrated) is formed at the center of the disc spring 71c, and an attachment shaft (not illustrated) is inserted into the shaft hole. The pressing portion 71 includes a plurality of disc springs 71c. The disc springs 71c are arrayed while being stacked in the axial direction of the attachment shaft. The disc springs 71c contact the housing 71a on one end side and the head part 71b on the other end side. Each disc spring 71c elastically deforms and generates pushing force when the interval between the housing 71a and the head part 71b is reduced and the disc springs 71c are sandwiched from both sides in the axial direction. The generated pushing force is larger as the number of disc springs 71c is larger.

Since the housing 71a is fixed to the attachment base 72, the pushing force of the disc springs 71c acts in such a direction that the head part 71b protrudes toward the front side. Accordingly, pressing force is applied from the head part 71b to the attachment mount 54.

As described above, the amount of protrusion of the housing 71a toward the front side is adjusted when the pressing portion 71 is rotated about the axis while the attachment base 72 is fixed to the rear ends of the rails 63. When the housing 71a protrudes toward the front side while the head part 71b contacts the attachment mount 54, the interval between the housing 71a and the head part 71b is reduced and the amount of elastic deformation of each disc spring 71c increases. Since the pushing force increases as the amount of elastic deformation of each disc spring 71c increases, the pushing force generated by each disc spring 71c is adjusted by adjusting the amount of protrusion of the housing 71a toward the front side. In this manner, the pressing force applied from the pressing unit 68 to the attachment mount 54 is adjusted through the protrusion amount of the housing 71a.

1.3.2 Operation

The following describes operation of the attachment mechanism 10 at attachment of the optical unit 56 to the chamber reference member 9 with reference to FIGS. 7A to 7E.

Before the operation description, a truck 76 used in the attachment of the optical unit 56 is described. As illustrated in FIG. 7A, the truck 76 includes a truck unit 76a, a support unit 76b, a hold rail 76c, and an elevation unit 76d. The truck unit 76a includes a wheel and can travel on the floor surface 12. The support unit 76b includes, for example, two elongated support plates, and is inserted between the leg parts 54b of the attachment mount 54 to support the lower surface of the attachment mount 54. The hold rail 76c movably holds the support unit 76b in the X direction. The elevation unit 76d adjusts the heights of the hold rail 76c and the support unit 76b in the Z direction. The support unit 76b and the elevation unit 76d may be driven electrically or manually.

As illustrated in FIG. 7A, when the optical unit 56 is attached to the chamber reference member 9, the optical unit 56 is mounted on the support unit 76b of the truck 76 in a posture in which the front side of the optical unit 56 coincides with the front side of the truck 76. In this state, the truck 76 is moved close to the rear end of the installation mechanism 7 so that the front side of the optical unit 56 faces the back side of the chamber reference member 9. The housing space 9b has an opening on the back surface in a state in which the lid 9c is removed, and the optical unit 56 is conveyed into the housing space 9b through the opening.

After the truck 76 is moved close to the installation mechanism 7, the elevation unit 76d is driven to adjust the optical unit 56 mounted on the support unit 76b to a predetermined height. Specifically, the height of the optical unit 56 on the support unit 76b is adjusted so that the upper surface of the body part 54a has a height T2 from the bottom surface 9d. The height T2 is lower than the installation height T1 when the optical unit 56 is placed on the mounts 61 by the thickness TH of the mounts 61. In other words, T2=T1−TH holds.

Since the height T2 is lower than the installation height T1 by the thickness TH of the mounts 61, the height of the bottom surface 9d is equal to the height up to the lower end of the ball caster 54c of each leg part 54b. At the height T2, the height TR of the guide surface 63a of each rail 63 is equal to the height of the lower end of the wheel 62.

After the height of the optical unit 56 is adjusted to the height T2 at the truck 76, conveyance of the optical unit 56 into the housing space 9b is started. The height T2 is the height of the optical unit 56 until the optical unit 56 is guided to the installation position, and thus referred to as a guide height T2 to distinguish from the installation height T1.

As illustrated in FIG. 7B, the support unit 76b on which the optical unit 56 is mounted moves relative to the hold rail 76c toward the front side in the X direction. Accordingly, the optical unit 56 is conveyed into the housing space 9b through the opening of the housing space 9b. Since the height of the optical unit 56 is adjusted to the guide height T2, the lower end of each wheel 62 of the optical unit 56 conveyed into the housing space 9b grounds on the guide surface 63a of the rail 63. In this state, the ball casters 54c of the leg parts 54b ground on the bottom surface 9d in the housing space 9b.

Figure 7C:
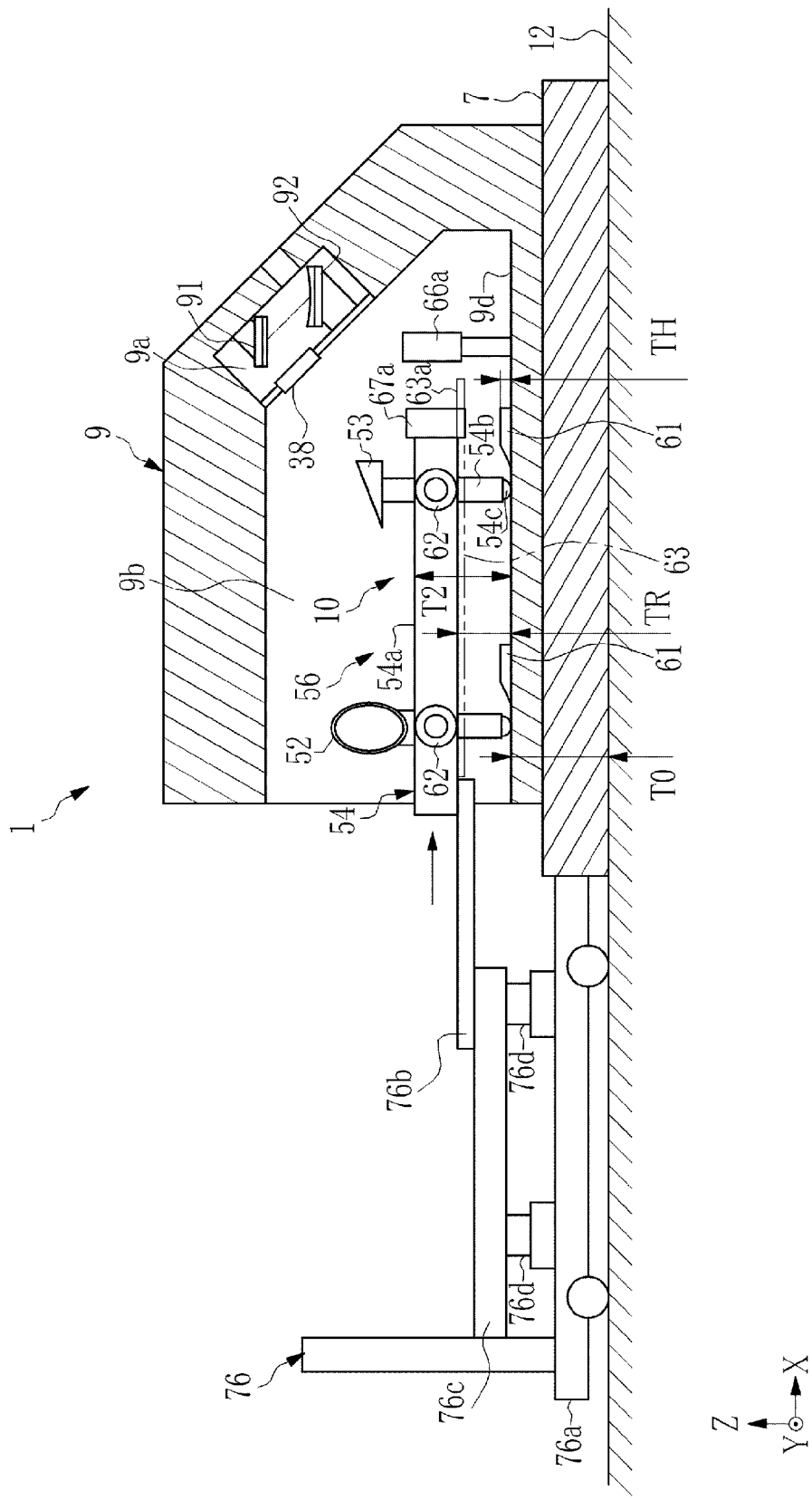
FIG. 7C is an explanatory diagram illustrating a second state halfway through conveyance of the optical unit illustrated in FIG. 7A into the chamber reference member.

As illustrated in FIG. 7C, the optical unit 56 in the state illustrated in FIG. 7B is pushed into the front side of the housing space 9b. At the state illustrated in FIG. 7B, each wheel 62 of the optical unit 56 grounds on the guide surface 63a of the rail 63. Thus, in this state, when the optical unit 56 is fed out from the back side toward the front side, the wheel 62 travels on the guide surface 63a of the rail 63, and the optical unit 56 moves to the front side of the housing space 9b in the X direction and is guided toward the installation position.

At the state illustrated in FIG. 7B, the ball casters 54c of the optical unit 56 ground on the bottom surface 9d in the housing space 9b, and travel on the bottom surface 9d when the optical unit 56 moves.

Since the ball casters 54c and the wheels 62 are rotational bodies, friction resistance when the optical unit 56 moves is reduced by the effect of the rotational body. Thus, the optical unit 56 can be moved by relatively small force.

As illustrated in FIGS. 4C and 5A, two of the leg parts 54b and two of the mounts 61 are provided on the front side, and the one leg part 54b and the one mount 61 are provided on the back side, and the positions of the two mounts 61 on the front side are different from the position of the one mount 61 on the back side in the width direction (Y direction). Thus, when the optical unit 56 moves in the X direction in the housing space 9b, the ball casters 54c of the leg parts 54b on the front side do not interfere with the mount 61 on the back side. The ball casters 54c of the leg parts 54b of the optical unit 56 travel on the bottom surface 9d until reaching the mount 61, and simultaneously, the wheels 62 travel on the guide surfaces 63a of the rails 63.

Figure 7D:
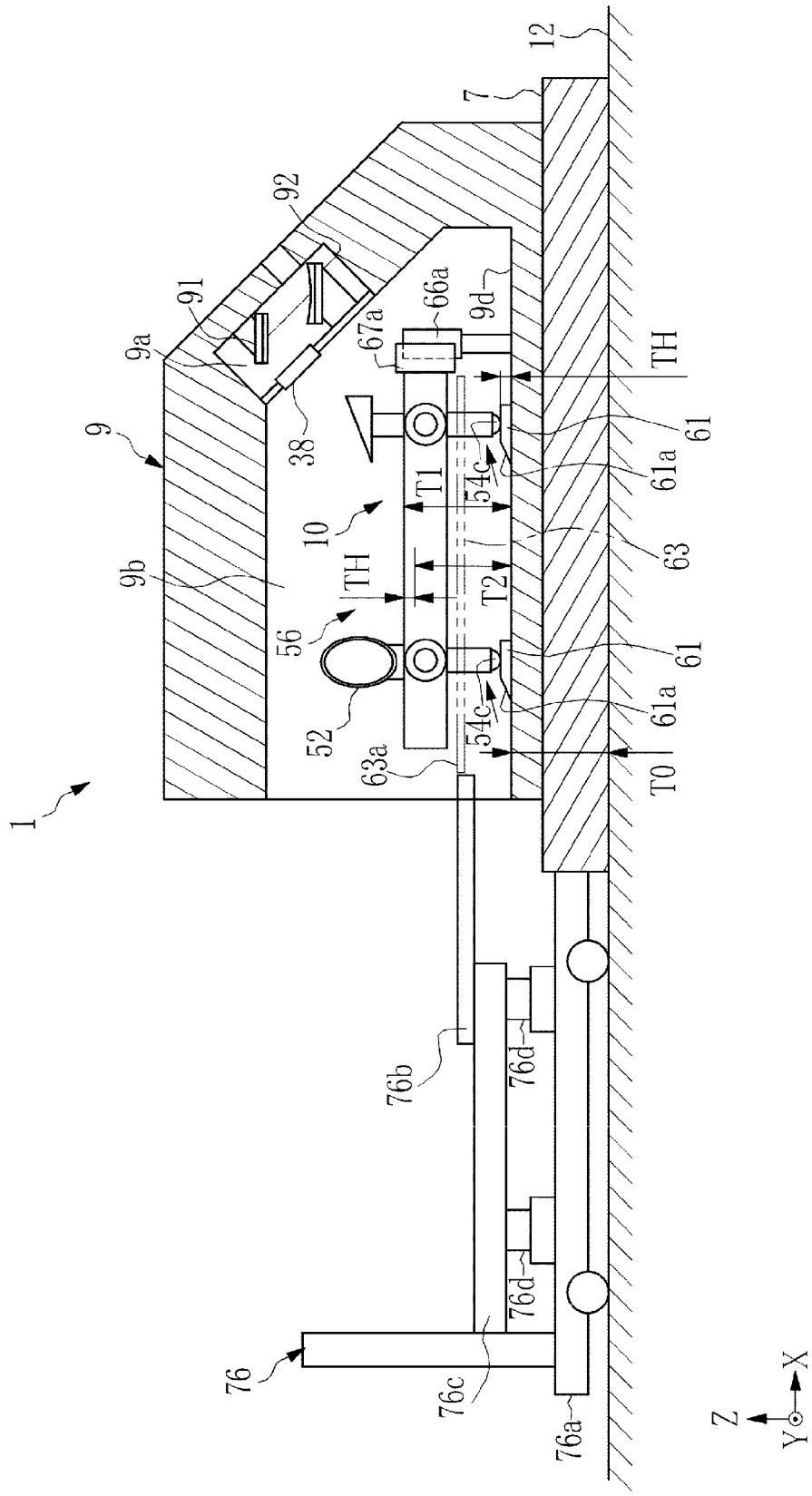
FIG. 7D is an explanatory diagram illustrating a state in which the optical unit illustrated in FIG. 7A is installed at a predetermined installation position in the chamber reference member.

As illustrated in FIG. 7D, when the optical unit 56 is further moved toward the front side after the ball caster 54c of each leg part 54b reaches a position right before the mount 61, the ball casters 54c travel on the slope 61a and the optical unit 56 starts rising from the guide height T2 toward the installation height T1. When the ball caster 54c moves up the slope 61a and the optical unit 56 moves onto the mounts 61, the optical unit 56 is placed on the mounts 61. At the installation position at which the optical unit 56 is placed on the mounts 61, the wheels 62 are separated from the guide surfaces 63a of the rails 63, and a gap of the thickness TH is generated therebetween. Accordingly, the optical unit 56 is positioned to the installation height T1 through the thickness TH of the mounts 61.

When the optical unit 56 is further pushed in the X direction at the installation position, the V-shaped block 67a and the flat block 67b contact the abutment pins 66a and 66b, respectively, thereby regulating movement of the optical unit 56 toward the front side in the X direction.

In this state, the pressing unit 68 is attached as illustrated in FIG. 7E. At the attachment of the pressing unit 68, first, the attachment base 72 is fixed to the rear ends of the rails 63. Since the pressing portion 71 is attached to the attachment base 72, the head part 71b of the pressing portion 71 contacts the rear end of the attachment mount 54 when the attachment base 72 is fixed to the rails 63.

After the attachment base 72 is fixed, the pressing force from the pressing unit 68 to the attachment mount 54 is adjusted by adjusting the amount of protrusion of the housing 71a of the pressing portion 71 toward the front side relative to the attachment base 72. Since the housing 71a is engaged with the attachment base 72 through the screws, the amount of protrusion of the housing 71a toward the front side is adjusted through feeding of the screws when the housing 71a is rotated relative to the attachment base 72. Accordingly, the amount of elastic deformation of the disc springs 71c sandwiched between the housing 71a and the head part 71b changes so that the pressing force from the head part 71b to the attachment mount 54 is adjusted.

When the pressing force of the pressing unit 68 is adjusted to a target pressing force, the V-shaped block 67a and the flat block 67b of the attachment mount 54 are pressed against the abutment pins 66a and 66b, respectively. Positioning of the optical unit 56 in the X direction is performed when the attachment mount 54 is pressed in the X direction by the target pressing force. Positioning of the optical unit 56 in the Y direction is performed when the abutment pin 66a enters into the V groove of the V-shaped block 67a up to an appropriate position. Accordingly, positioning of the optical unit 56 in the horizontal direction (the X and Y directions) is performed. After the positioning in the horizontal direction, the lid 9c is attached to the chamber reference member 9 to seal the inside of the housing space 9b as illustrated in FIG. 7F.

1.4 Problem

In the attachment mechanism 10 of the comparative example, the guide height T2 of the optical unit 56 right after the optical unit 56 is conveyed from the truck 76 into the housing space 9b is different from the installation height T1 while the optical unit 56 is placed on the mount 61. The installation height T1 is higher than the guide height T2 by the thickness TH of the mounts 61.

Thus, in the housing space 9b, the optical unit 56 needs to be elevated up from the guide height T2 to the installation height T1 on the mounts 61. The thickness TH of the mounts 61 is, for example, 2 mm approximately, but momentum is needed to move the optical unit 56 up the slope 61a when the weight of the optical unit 56 is relatively heavy. In this case, impact when the ball casters 54c collide with the slope 61a, and impact when the V-shaped block 67a and the flat block 67b collide with the abutment pins 66a and 66b right after the optical unit 56 moves up the slope 61a are large in some cases.

When such collision impact is large, optical alignment of the laser beam introduction optical system including the beam splitter 52 and the high reflectance mirror 53 fixed on the attachment mount 54 is potentially shifted. The optical alignment of a laser beam introduction optical system in an EUV light generation apparatus configured to generate plasma from a target substance irradiating the target substance with a laser beam is extremely important, and the alignment shift needs to be reduced as much as possible.

2. First Embodiment

The following describes an EUV light generation apparatus 1A according to a first embodiment of the present disclosure. In the first embodiment, the overall configurations of the EUV light generation apparatus 1 and the EUV light generation system that uses the EUV light generation apparatus 1, which are described in the comparative example, are substantially same. The first embodiment is mainly different from the comparative example in the attachment mechanism of the laser beam introduction optical system, and the following description is mainly made on the difference.

Hereinafter, any part identical to a component of the comparative example is denoted by an identical reference sign, and description thereof is omitted as appropriate.

Figure 8A:
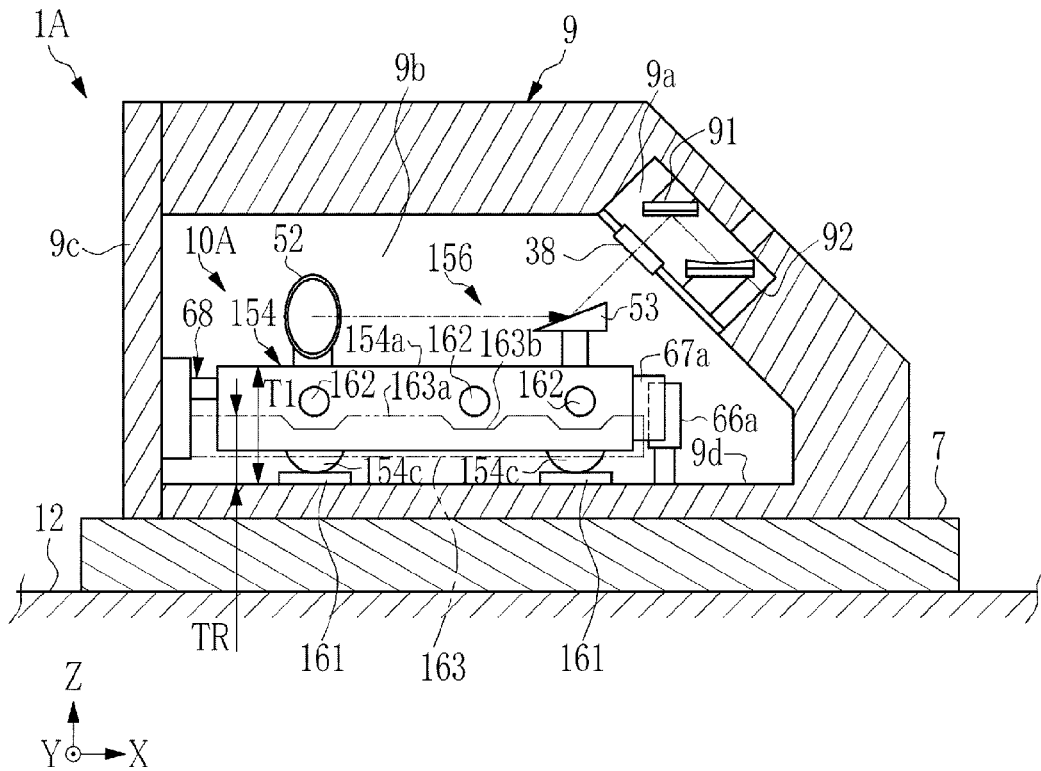
FIG. 8A is a side view of an optical unit attached to a chamber reference member according to a first embodiment when viewed from side.
Figure 8B:
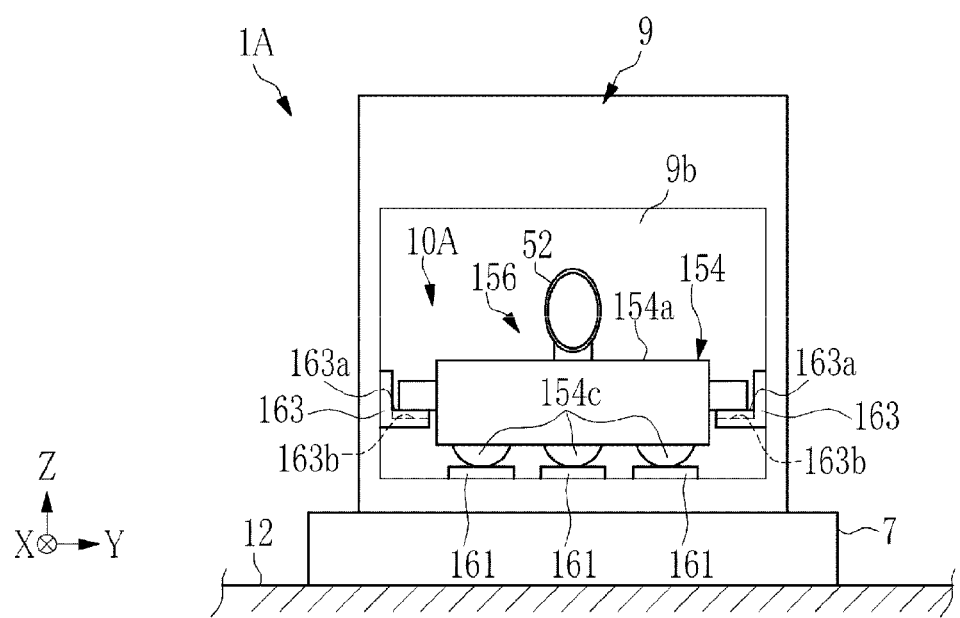
FIG. 8B is a back view of the optical unit illustrated in FIG. 8A when viewed from the back side of the chamber reference member from which a lid is removed.
Figure 8C:
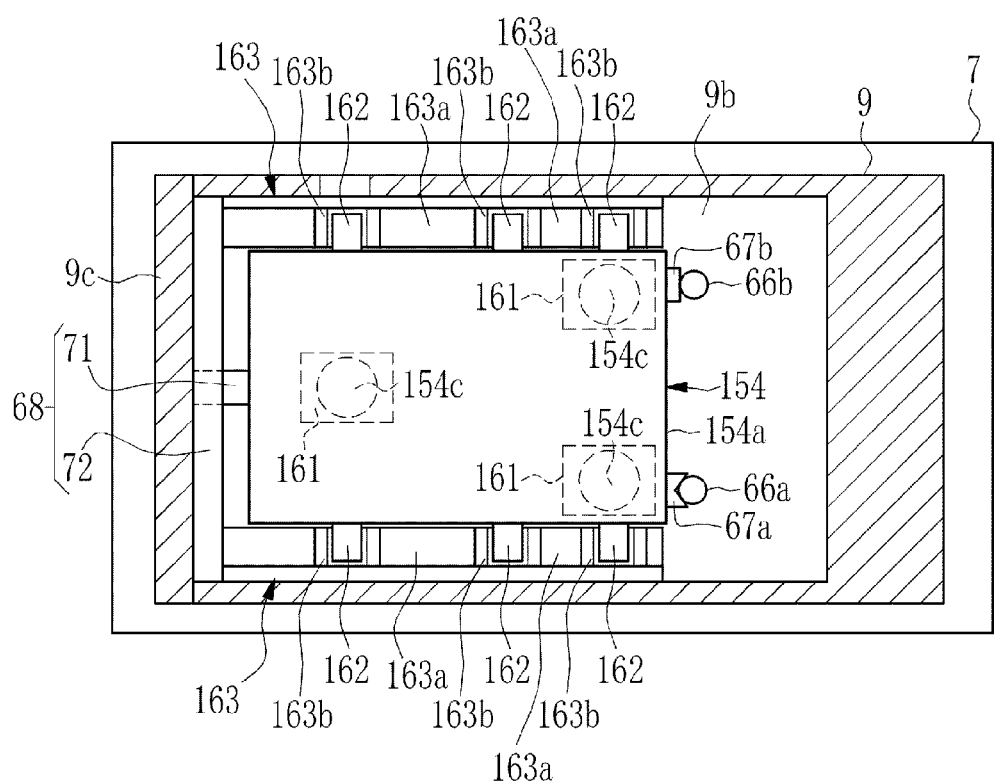
FIG. 8C is a plan view of the optical unit illustrated in FIG. 8A when viewed from above the chamber reference member.
Figure 9A:
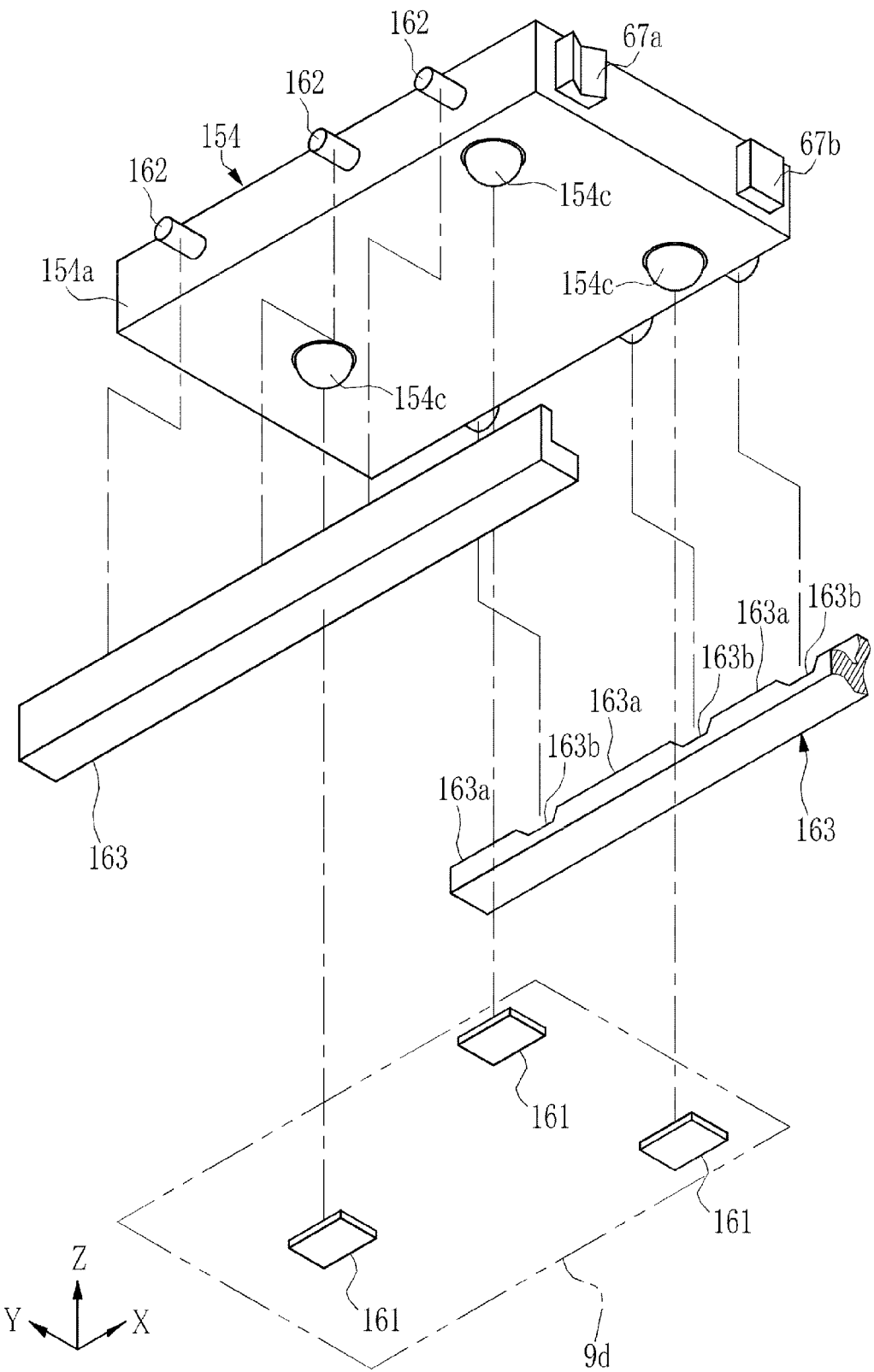
FIG. 9A is an exploded perspective view of part of the configuration of an attachment mechanism of the optical unit according to the first embodiment when viewed obliquely from below.

2.1 Description of Attachment Mechanism of Laser Beam Introduction Optical System of the First Embodiment 2.1.1 Configuration FIGS. 8A to 8C, 9A, and 9B are each an explanatory diagram of an attachment mechanism 10A configured to attach a laser beam introduction optical system of the first embodiment to the chamber reference member 9. An attachment mount 154 of the first embodiment includes a body part 154a and a ball caster 154c. As illustrated in FIGS. 8A, 8B, and 9A, the ball caster 154c is partially embedded in a lower surface of the body part 154a. The beam splitter 52 and the high reflectance mirror 53 are attached and fixed to predetermined positions on an upper surface of the body part 154a.

In the first embodiment, unlike the attachment mount 54 of the comparative example, the attachment mount 154 does not include the leg parts 54b, but may include the leg parts 54b.

In the first embodiment, similarly to the comparative example, the attachment of the beam splitter 52 and the high reflectance mirror 53 to the attachment mount 154 is performed outside of the chamber reference member 9. Similarly to the comparative example, the attachment mechanism 10A of the first embodiment is used at maintenance to attach an optical unit 156 including the attachment mount 154 to the chamber reference member 9.

Figure 9B:
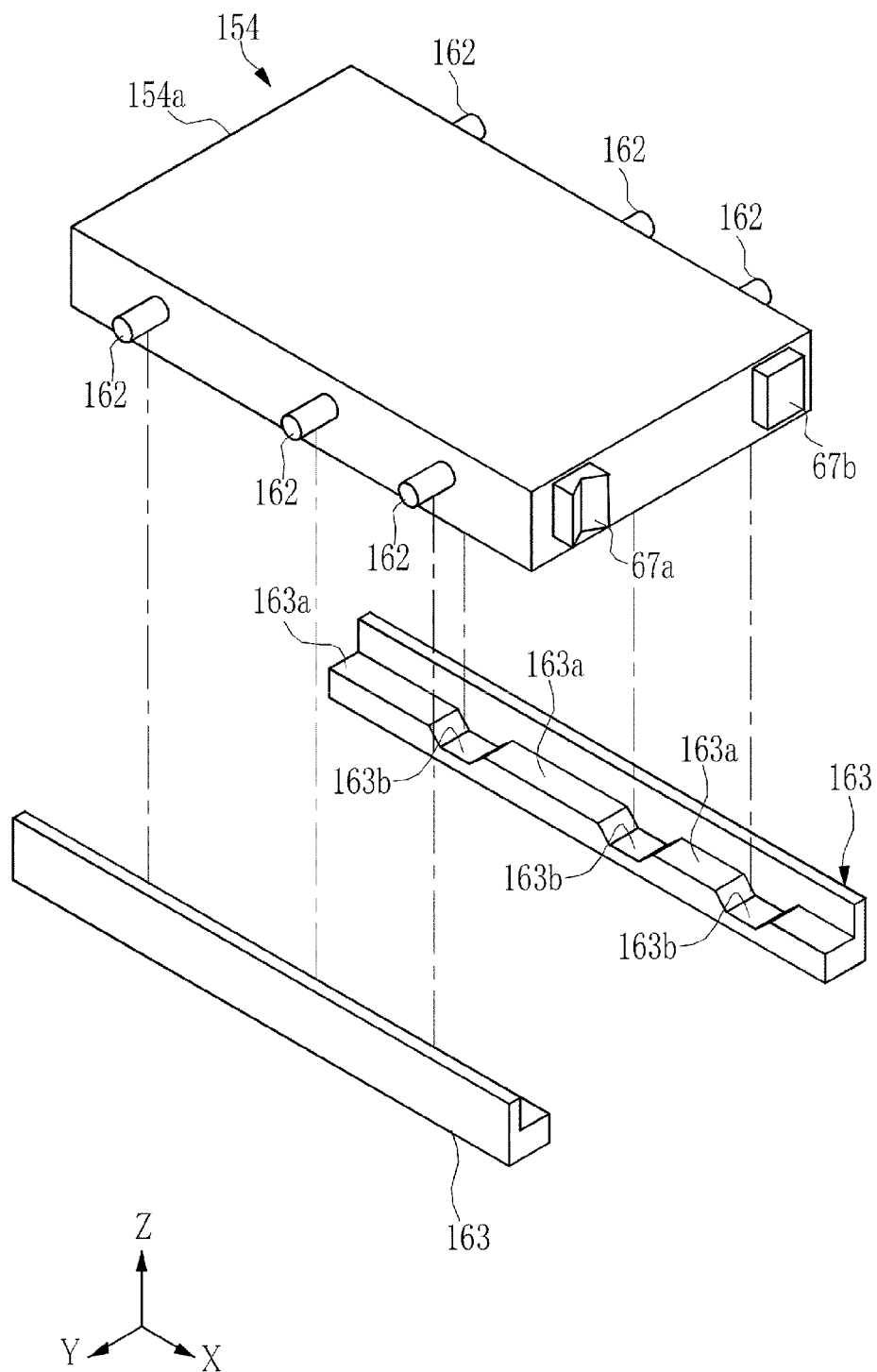
FIG. 9B is an exploded perspective view of part of the component in FIG. 9A when viewed obliquely from above.

FIGS. 8A to 8C are each an explanatory diagram of the attachment mechanism 10A, and the optical unit 156 being positioned and fixed to a predetermined installation position in the housing space 9b of the chamber reference member 9, and correspond to FIGS. 4A to 4C of the comparative example. FIGS. 9A and 9B are each an exploded perspective view illustrating the attachment mount 154 of the optical unit 156 and part of the configuration of the attachment mechanism 10A, and correspond to FIGS. 5A and 5B of the comparative example.

The attachment mechanism 10A of the first embodiment includes a movement mechanism and a positioning mechanism. The positioning mechanism includes a height positioning mechanism and a horizontal direction positioning mechanism. The height of the optical unit 156 from the bottom surface 9d of the chamber reference member 9 is positioned by the height positioning mechanism.

2.1.1.1 Height Positioning Mechanism

As illustrated in FIGS. 8A to 8C and 9A, the bottom surface 9d is provided with a mount 161. The ball caster 154c of the attachment mount 54 is placed on the mount 161. As illustrated in FIGS. 8C and 9A, the three ball casters 154c are provided: for example, two on the front side of the body part 54a, and one on the back side. The three mounts 161 are provided in a manner corresponding to the three ball casters 154c, and the disposition interval of the mounts 161 corresponds to the disposition interval of the ball casters 154c.

As illustrated in FIGS. 8A and 8B, when the three ball casters 154c are placed on the respective mounts 161, the attachment mount 154, more specifically, the upper surface of the body part 154a is positioned to the installation height T1 from the bottom surface 9d. In the first embodiment, similarly to the mounts 61 of the comparative example, the mounts 161 are included in the height positioning mechanism configured to position the optical unit 156 to the predetermined installation height T1 at the installation position in the housing space 9b while contacting the ball casters 154c of the optical unit 156. Accordingly, the height of the laser beam introduction optical system fixed to the attachment mount 154 is adjusted. Each ball caster 154c corresponds to a first part of the optical unit 156.

Each mount 161 is a flat plate. Unlike the mount 61 of the comparative example, the mount 161 is provided with no slope.

2.1.1.2 Movement Mechanism

As illustrated in FIGS. 8A to 8C, 9A, and 9B, the movement mechanism includes a wheel 162 and a rail 163. The three wheels 162 are provided to each of right and left side surfaces on both sides of the body part 154a of the attachment mount 154 in the width direction (Y direction).

Similarly to the comparative example, the two rails 163 are individually attached to right and left sidewalls inside the housing space 9b of the chamber reference member 9. As illustrated in FIG. 8B, similarly to the rail 63 of the comparative example, each rail 163 has an L-shaped section and is attached to the sidewall of the housing space 9b. The disposition interval of the right and left rails 63 in the width direction (Y direction) corresponds to the disposition interval of the right and left wheels 162 of the attachment mount 154.

As illustrated in FIGS. 8A, 9A, and 9B, similarly to the rails 63 of the comparative example, each rail 163 of the first embodiment is a guide member extending in the X direction as the moving direction in which the optical unit 156 is guided. The rail 163 has, on an upper surface, a guide surface 163a on which the wheel 162 travels in contact. Similarly to the comparative example, the guide surface 163a is a travel surface on which the wheel 162 travels in contact, and guides the optical unit 156 to the installation position.

The movement mechanism including the wheels 162 and the rails 163 linearly moves the optical unit 156 in the horizontal direction while keeping the optical unit 156 at a constant height in the housing space 9b.

Each wheel 162 is a rotational body that rotates while contacting the guide surface 163a, and corresponds to a second part of the optical unit 156. The three wheels 162 are disposed on each rail 163 in the X direction.

Unlike the comparative example, the rail 163 is provided with a retraction part 163b in addition to the guide surface 163a. The retraction part 163b is a bottomed recess lower than the guide surface 163a. The three retraction parts 163b are provided to each rail 163 in a manner corresponding to the number and disposition interval of the wheels 162. As illustrated in FIG. 8A, a gap is generated between the retraction part 163b and the wheel 162 when the optical unit 156 is placed on the mount 161. Accordingly, the wheels 162 included in the movement mechanism are retracted from the guide surface 163a to the retraction parts 163b when the optical unit 156 reaches the installation position on the mount 161.

As a result, the guide surface 163a is separated from the wheels 162, which ends the guide by the movement mechanism. Thus, at the installation position on the mounts 161, the optical unit 156 is positioned at the installation height T1 only with the thickness TH of the mounts 161 without interference of the rails 163 and the wheels 162.

The height TR of the guide surface 163a of each rail 163 from the bottom surface 9d is equal to the height from the bottom surface 9d to the lower end of the wheel 162 when the optical unit 156 is at the installation height T1. In other words, unlike the comparative example, in the first embodiment, the guide height of the optical unit 156 while being guided to move toward the installation position by the guide surface 163a of the rail 163 is equal to the installation height T1.

Figure 10A:
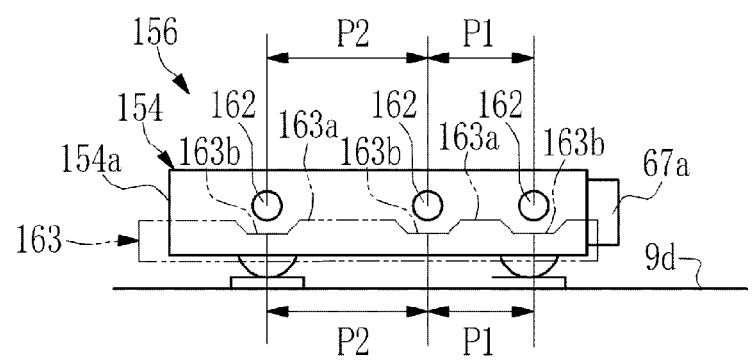
FIG. 10A is an explanatory diagram of the disposition pitch of a retraction part according to the first embodiment.

As illustrated in FIG. 10A, the disposition pitch of the three wheels 162 disposed in the moving direction (X direction) has unequal intervals. Specifically, a pitch P1 between the first and second wheels 162 on the front side is different from a pitch P2 between the second wheel 162 and the third wheel 162. The disposition pitch of the three retraction parts 163b of each rail 163 corresponds to the disposition pitch of the three wheels 162. Specifically, the number of retraction parts 163b is equal to the number of wheels 162, and the retraction parts 163b are disposed at positions facing the respective three wheels 162 in the optical unit 156 at the installation position.

Figure 10B:
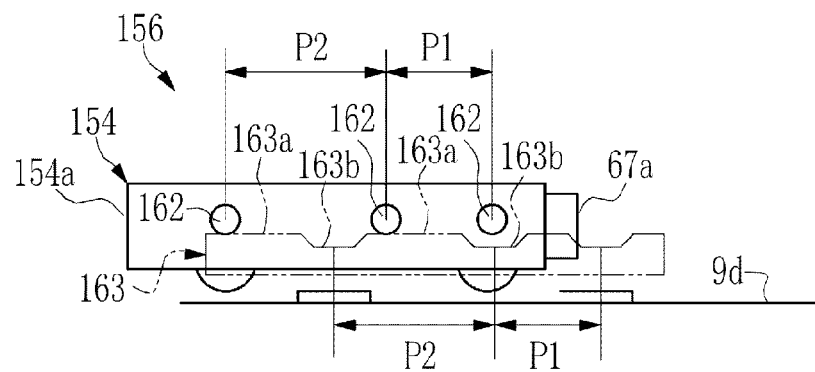
FIG. 10B is an explanatory diagram of the disposition pitch when the optical unit is in a state different from the state in FIG. 10A.

As illustrated in FIG. 10B, the first wheel 162 and the second wheel 162 pass above at least one of the retraction parts 163b until the wheels 162 travel on the guide surfaces 163a of the rails 163 and the optical unit 156 reaches the installation position illustrated in FIG. 10A. In this case, since the three wheels 162 are provided at unequal intervals, the three wheels 162 do not simultaneously pass above the retraction part 163b until reaching the installation position. Accordingly, a state in which the two wheels 162 ground on the guide surface 163a while the at least one wheel 162 passes above the retraction part 163b is maintained.

2.1.1.3 Horizontal Direction Positioning Mechanism

As illustrated in FIGS. 8C, 9A, and 9B, similarly to the comparative example, the horizontal direction positioning mechanism includes the abutment pins 66a and 66b, the V-shaped block 67a, the flat block 67b, and the pressing unit 68. The configuration and function of each component of the horizontal direction positioning mechanism of the first embodiment are same as those of the comparative example.

2.1.2 Operation

The following describes operation of the attachment mechanism 10A at attachment of the optical unit 156 to the chamber reference member 9 with reference to FIGS. 11A to 11F. In the first embodiment, similarly to the comparative example, the truck 76 is used at the attachment.

Figure 11A:
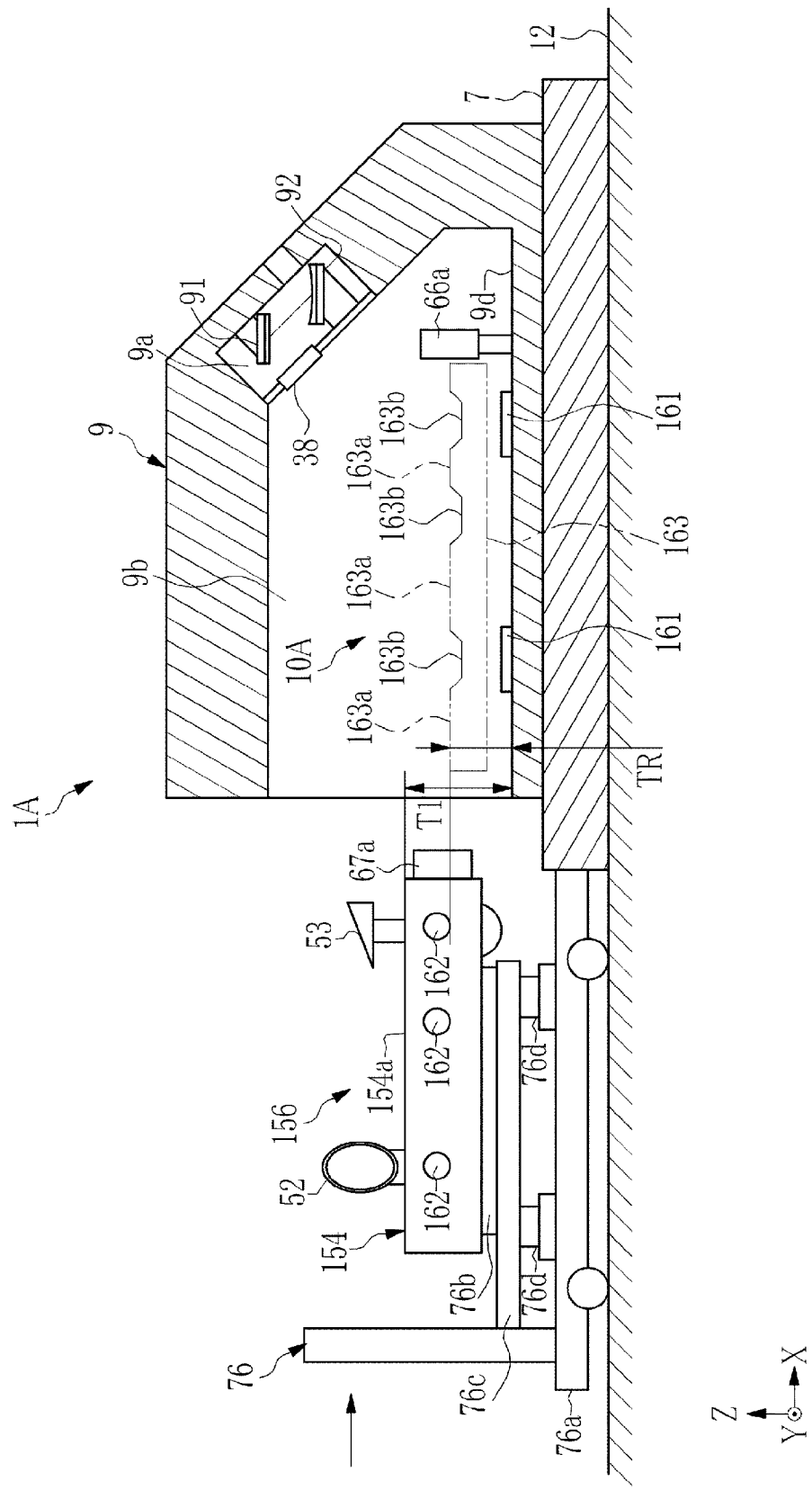
FIG. 11A is an explanatory diagram of a state in which a truck on which the optical unit according to the first embodiment is mounted is moved close to the chamber reference member.

As illustrated in FIG. 11A, in the first embodiment, when the optical unit 156 is attached to the chamber reference member 9, the optical unit 56 is mounted on the support unit 76b of the truck 76 in a posture same as that of the comparative example. In this state, the truck 76 is moved close to the rear end of the installation mechanism 7 so that the front side of the optical unit 56 faces the back side of the chamber reference member 9.

Thereafter, the elevation unit 76d is driven to adjust the height of the optical unit 56 mounted on the support unit 76b to a predetermined height. In the first embodiment, unlike the comparative example, the height of the optical unit 56 on the support unit 76b is adjusted so that the height of the upper surface of the body part 154a from the bottom surface 9d is equal to the installation height T1. At the installation height T1, the height of the guide surface 163a is equal to the height of the lower end of each ball caster 154c.

After the height of the optical unit 156 is adjusted to the installation height T1 in the truck 76, conveyance of the optical unit 156 into the housing space 9*b* is started. Specifically, in the first embodiment, since the installation height T1 is equal to the guide height of the optical unit 56 until the optical unit 56 is guided to the installation position, the guide in the X direction is started at the installation height T1.

As illustrated in FIG. 11B, the support unit 76*b* on which the optical unit 156 is mounted moves toward the front side in the X direction relative to the hold rail 76*c*. Accordingly, the optical unit 156 is conveyed into the housing space 9*b*. Since the height of the optical unit 156 is adjusted to the installation height T1, the lower end of each wheel 162 grounds on the guide surface 163*a* of the rail 163 in the optical unit 156 conveyed into the housing space 9*b*. Each ball caster 154*c* does not ground on the bottom surface 9*d* until reaching the installation position on the mount 61.

Figure 11C:
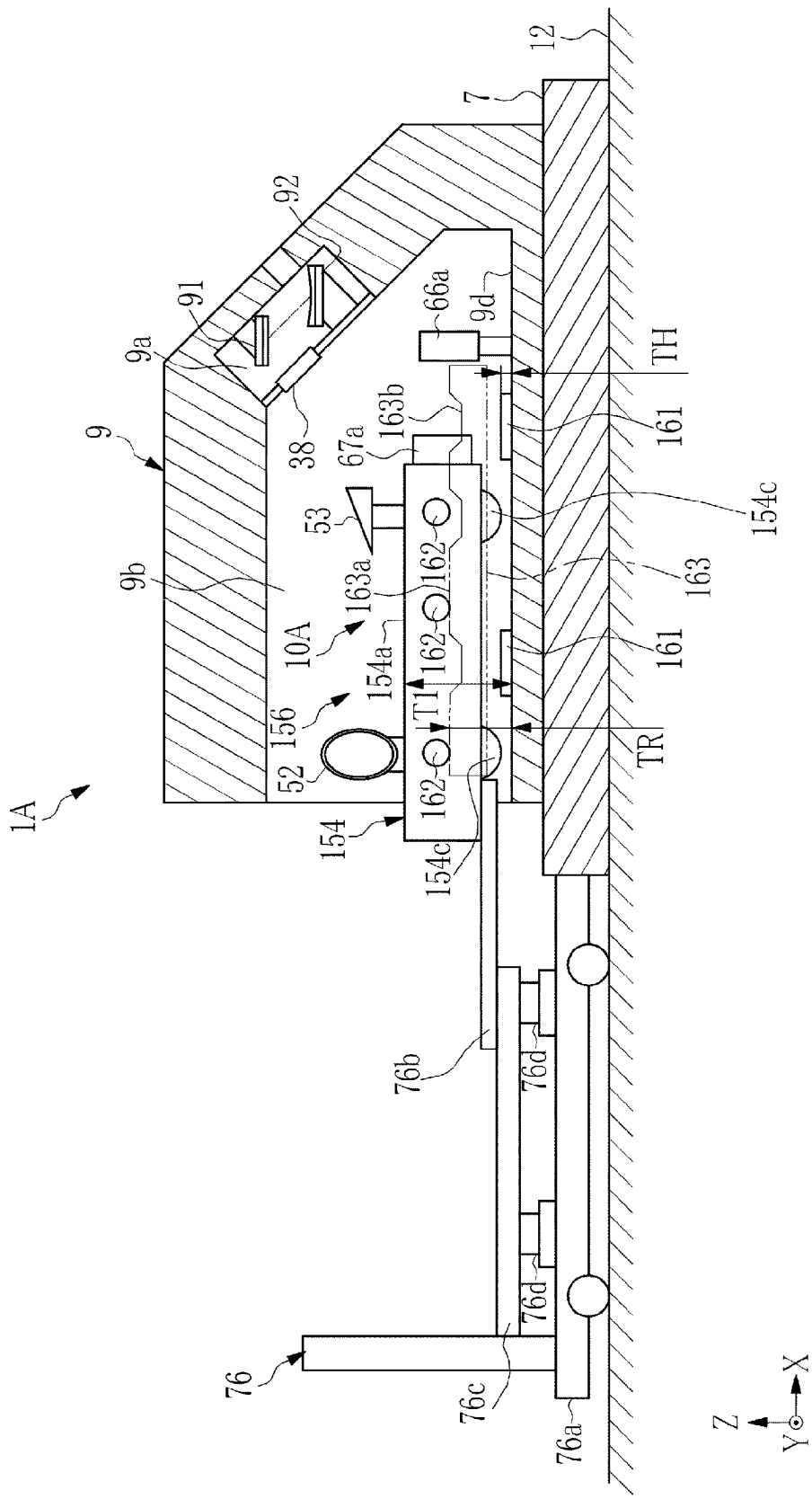
FIG. 11C is an explanatory diagram illustrating a second state halfway through conveyance of the optical unit illustrated in FIG. 11A into the chamber reference member.

As illustrated in FIG. 11C, the optical unit 156 in the state illustrated in FIG. 11B is pushed into the front side of the housing space 9*b*. At the state illustrated in FIG. 11B, each wheel 162 grounds on the guide surface 163*a* of the rail 163. Thus, the wheel 162 travels on the guide surface 163*a* of the rail 163, and the optical unit 156 moves to the front side of the housing space 9*b*. Since resistance at the movement of the optical unit 156 is reduced by the effect of the wheel 162, the optical unit 156 can be moved by relatively small force. Since the wheel 162 is guided by the guide surface 163*a* of the rail 163, the optical unit 156 travels straight in the X direction.

Since the retraction parts 163*b* of the three wheels 162 and the three rails 163 are disposed at unequal intervals, the two wheels 162 do not simultaneously drop into the retraction part 163*b* until the optical unit 156 reaches the installation position at the mounts 161. Thus, the optical unit 156 is guided toward the installation position in a stable posture without a tilt at a constant height.

While each wheel 162 travels on the guide surface 163*a*, there is a gap of the thickness TH of the mount 161 between the ball caster 154*c* and the mount 161. In addition, as illustrated in FIG. 8C, the positions of the two mounts 161 on the front side are different from the position of the one mount 161 on the back side in the width direction (Y direction). Thus, each ball caster 154*c* on the front side does not interfere with any mount 161 on the back side when the optical unit 156 moves in the X direction.

Figure 11D:
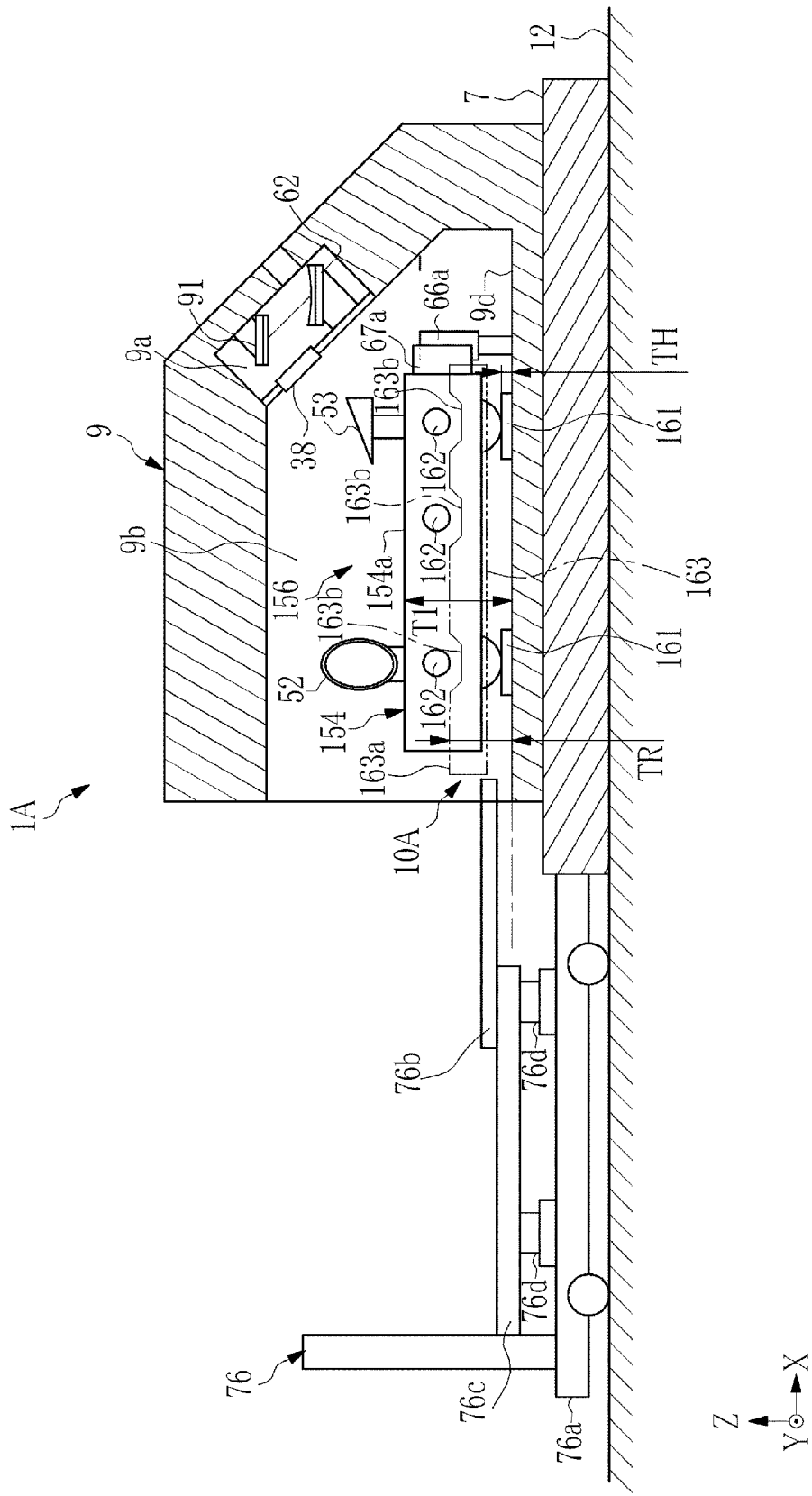
FIG. 11D is an explanatory diagram illustrating a state in which the optical unit illustrated in FIG. 11A is installed at a predetermined installation position in the chamber reference member.

As illustrated in FIG. 11D, each ball caster 154*c* grounds on the mount 161 when reaching the installation position on the mount 161. Accordingly, the optical unit 56 is placed on the mounts 61. In this state, the three wheels 162 reaches the positions of the three respective retraction parts 163*b* of the rail 163 and thus the wheels 162 are retracted and separated from the guide surfaces 163*a*. Accordingly, the optical unit 156 is positioned to the installation height T1 by the thickness TH of the mounts 161. Thus, accurate positioning in the height direction can be performed by accurately adjusting the thickness TH of the mounts 161.

Unlike the comparative example, in the first embodiment, the movement mechanism guides the optical unit 156 to the installation position on the mounts 161 at the guide height equal to the installation height T1. Accordingly, impact when the ball casters 54*c* collide with the mounts 61, and impact when the optical unit 56 is mounted on the mounts 61 with momentum and the V-shaped block 67*a* and the flat block 67*b* collide with the abutment pins 66*a* and 66*b* with momentum are not generated unlike the comparative example. Thus, the alignment of the beam splitter 52 and the high reflectance mirror 53 of the optical unit 156 is prevented from being shifted by such impact.

When the optical unit 156 is pushed further in the X direction while being placed on the mounts 161, the V-shaped block 67*a* and the flat block 67*b* contact the abutment pins 66*a* and 66*b*, thereby regulating movement of the optical unit 56 in the X direction.

Figure 11E:
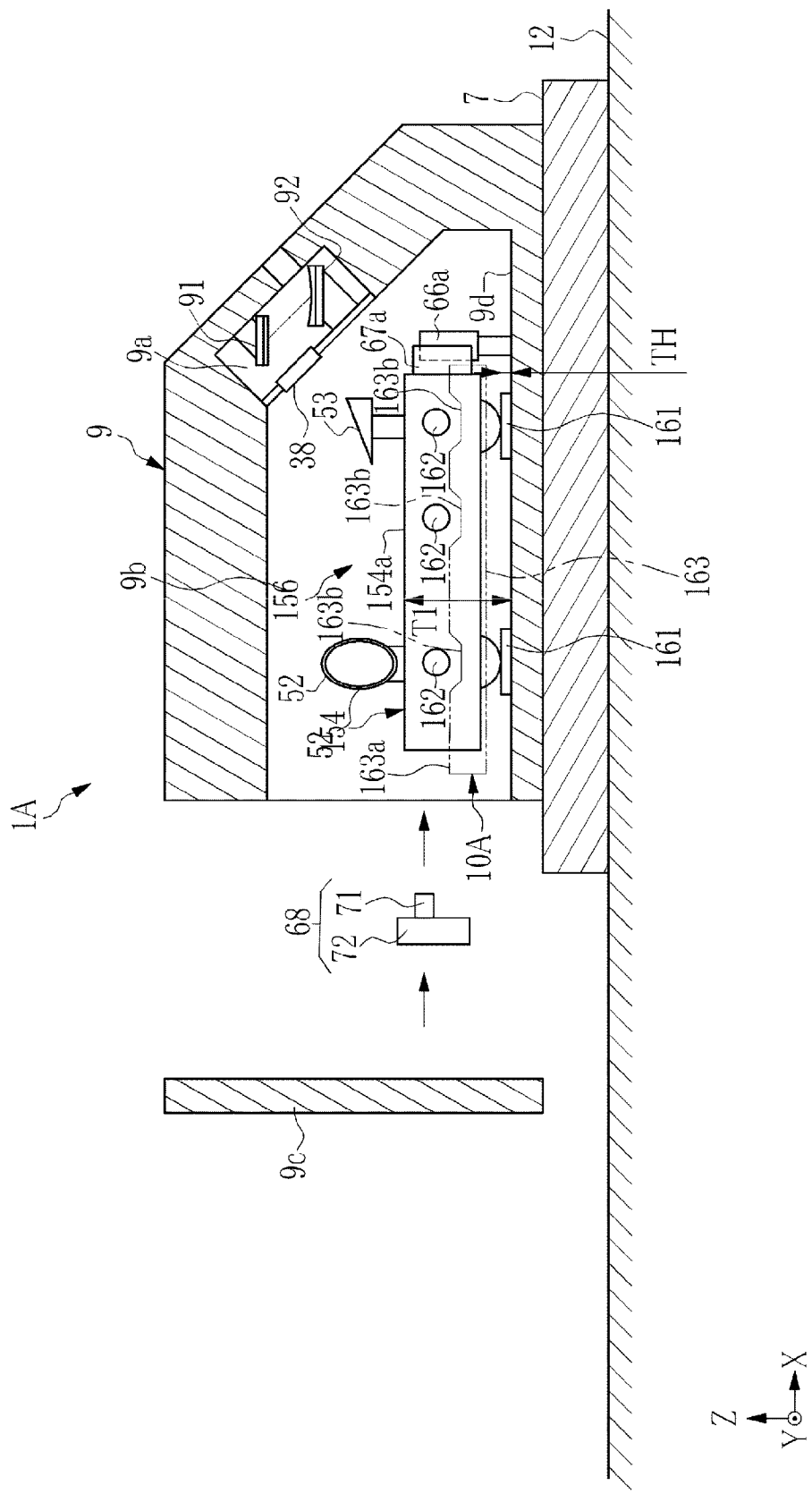
FIG. 11E is an explanatory diagram illustrating a state in which a pressing unit is attached to the optical unit illustrated in FIG. 11A.
Figure 11F:
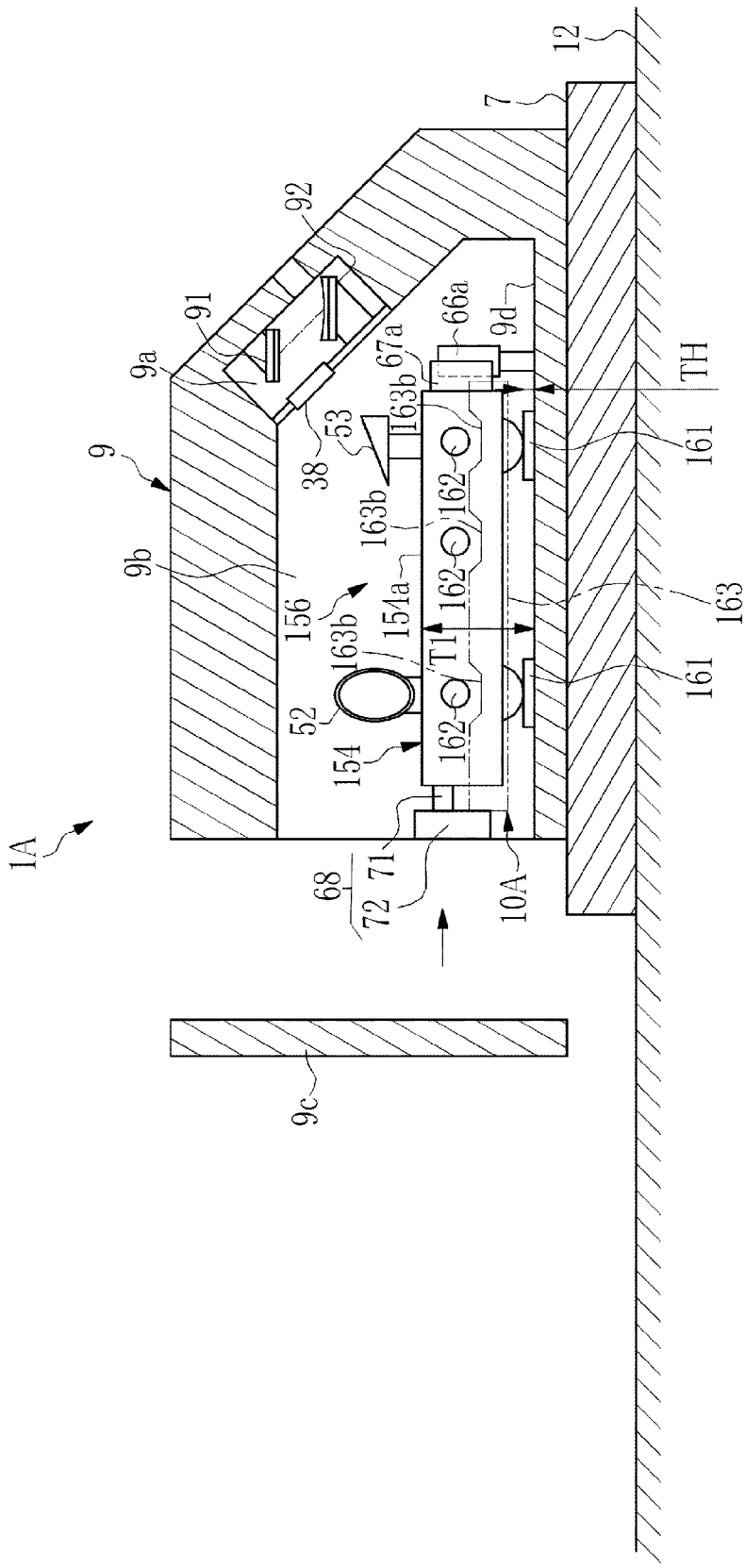
FIG. 11F is an explanatory diagram of a state in which the lid of the chamber reference member is attached after the state in FIG. 11E.

In this state, the pressing unit 68 is attached as illustrated in FIG. 11E. The method of attaching the pressing unit 68 and the effect of positioning in the horizontal direction (the X and Y directions) are same as those of the comparative example. After the positioning in the horizontal direction, the lid 9*c* is attached to the chamber reference member 9 as illustrated in FIG. 11F.

In the present example, the installation height T1 and the guide height are equal to each other. This state of equal to each other means a state of substantially equal to each other. The state of substantially equal to each other includes a state that allows error in addition to a state of completely equal to each other. The error allowed in the state of substantially equal to each other includes error in which a small magnitude of impact that does not affect optical alignment is generated. For example, when there is a small amount of difference between the installation height T1 and the guide height of guide through the wheels 162 and the guide surfaces 163*a* of the rails 163, but the difference only generates a small magnitude of impact that does not affect the optical alignment, the state having such difference is included in the state of substantially equal to each other. The inventors have checked that impact is negligible when the difference between the guide height and the installation height is equal to or smaller than 0.5 mm. The difference between the guide height and the installation height is desirably smaller than 2 mm at least.

2.2 Modification of Rail

Figure 12:
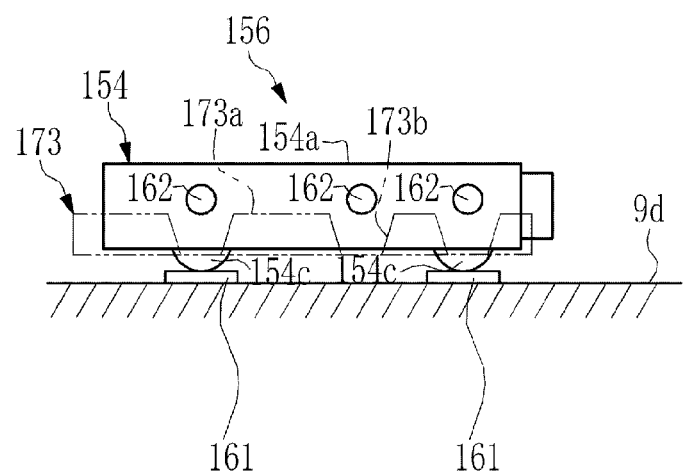
FIG. 12 is a side view illustrating a modification of a rail.
Figure 13:
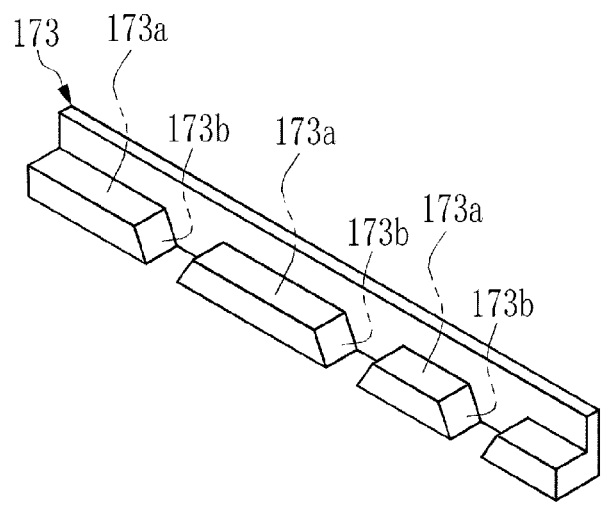
FIG. 13 is a perspective view illustrating the modification of the rail.

A rail 173 illustrated in FIGS. 12 and 13 is a modification of the rail 163 of the above-described first embodiment. In the rail 163 of the first embodiment, the retraction part 163*b* has a bottomed recess shape lower than the guide surface 163*a*. However, a retraction part 173*b* as a bottomless gap may be provided as in the rail 173 of the modification illustrated in FIGS. 12 and 13.

2.3. Others

In the present example, the three wheels 162 included in the movement mechanism are arrayed in the moving direction (X direction), but three or more wheels may be arrayed. In this case, the retraction parts 163*b* are provided in accordance with the number and disposition pitch of wheels 162.

3. Second Embodiment

The following describes an EUV light generation apparatus 1B of a second embodiment. The second embodiment has a basic configuration same as that of the first embodiment, and has difference in the configuration of an attachment mechanism 10B of the second embodiment. The following description is mainly made on the difference, and any part identical to a component of the first embodiment is denoted by an identical reference sign, and description thereof is omitted as appropriate.

Figure 14A:
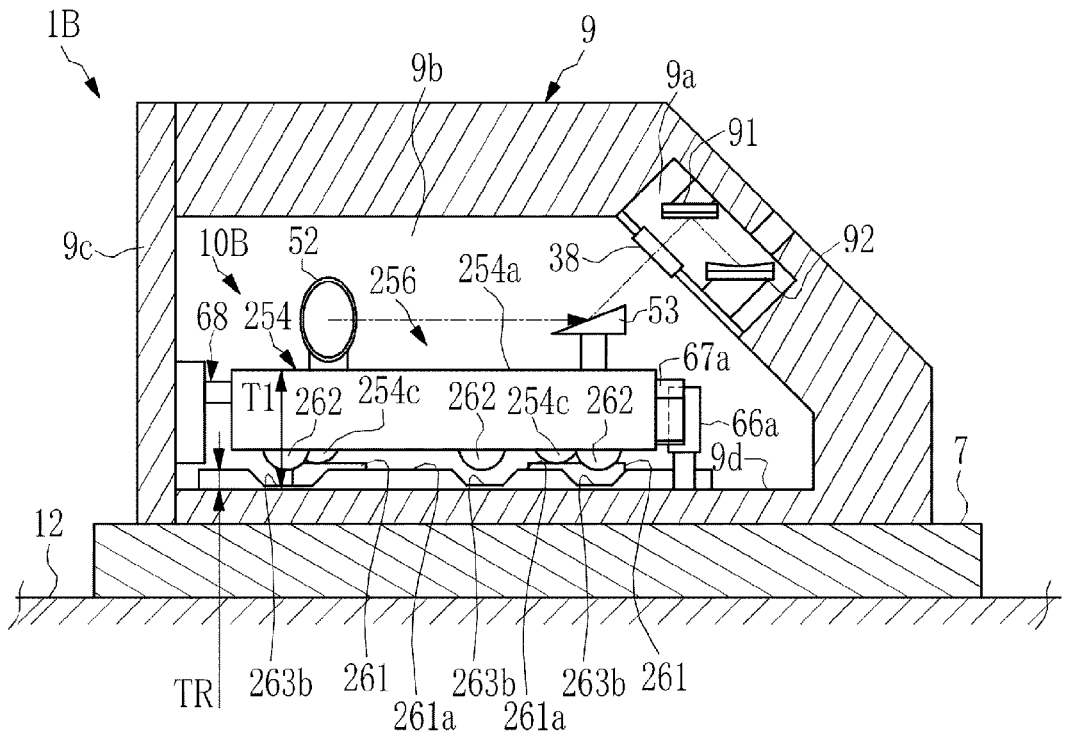
FIG. 14A is a side view of an optical unit attached to a chamber reference member according to a second embodiment when viewed from side.
Figure 14B:
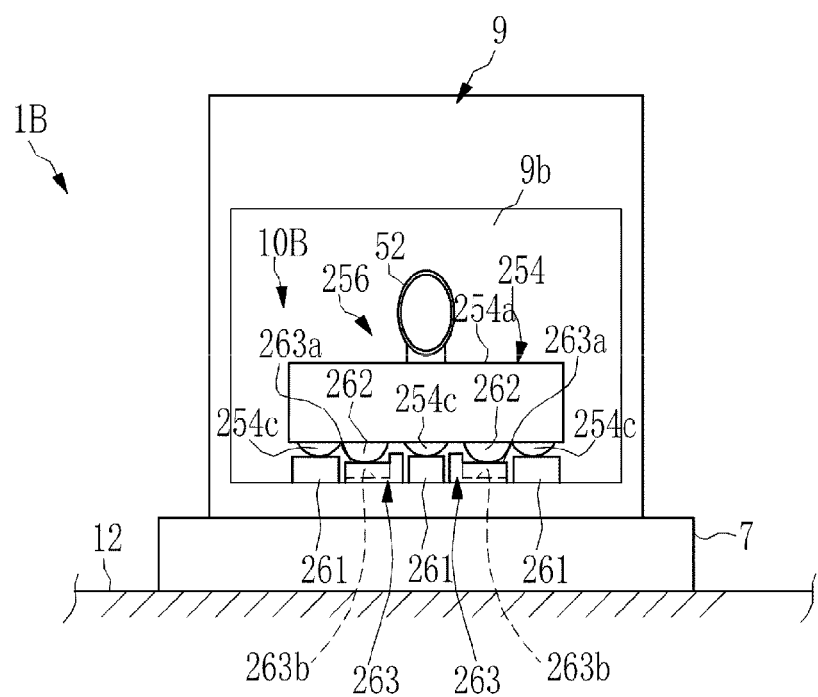
FIG. 14B is a back view of the optical unit illustrated in FIG. 14A when viewed from the back side of the chamber reference member from which a lid is removed.
Figure 14C:
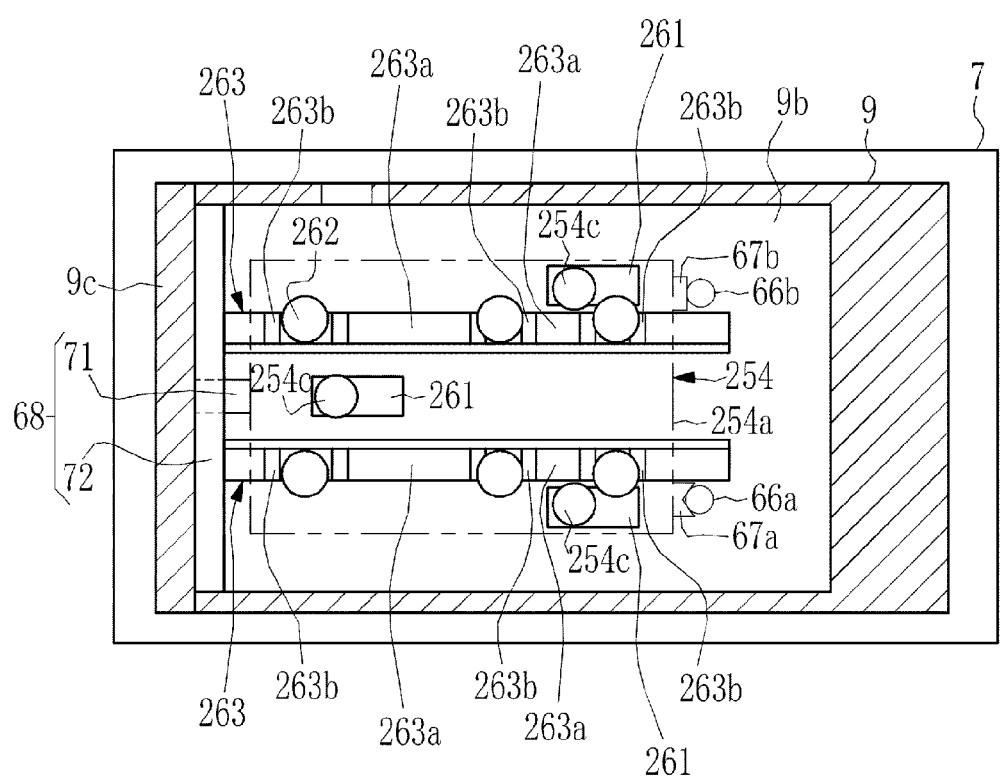
FIG. 14C is a plan view of the optical unit illustrated in FIG. 14A when viewed from above the chamber reference member.
Figure 15A:
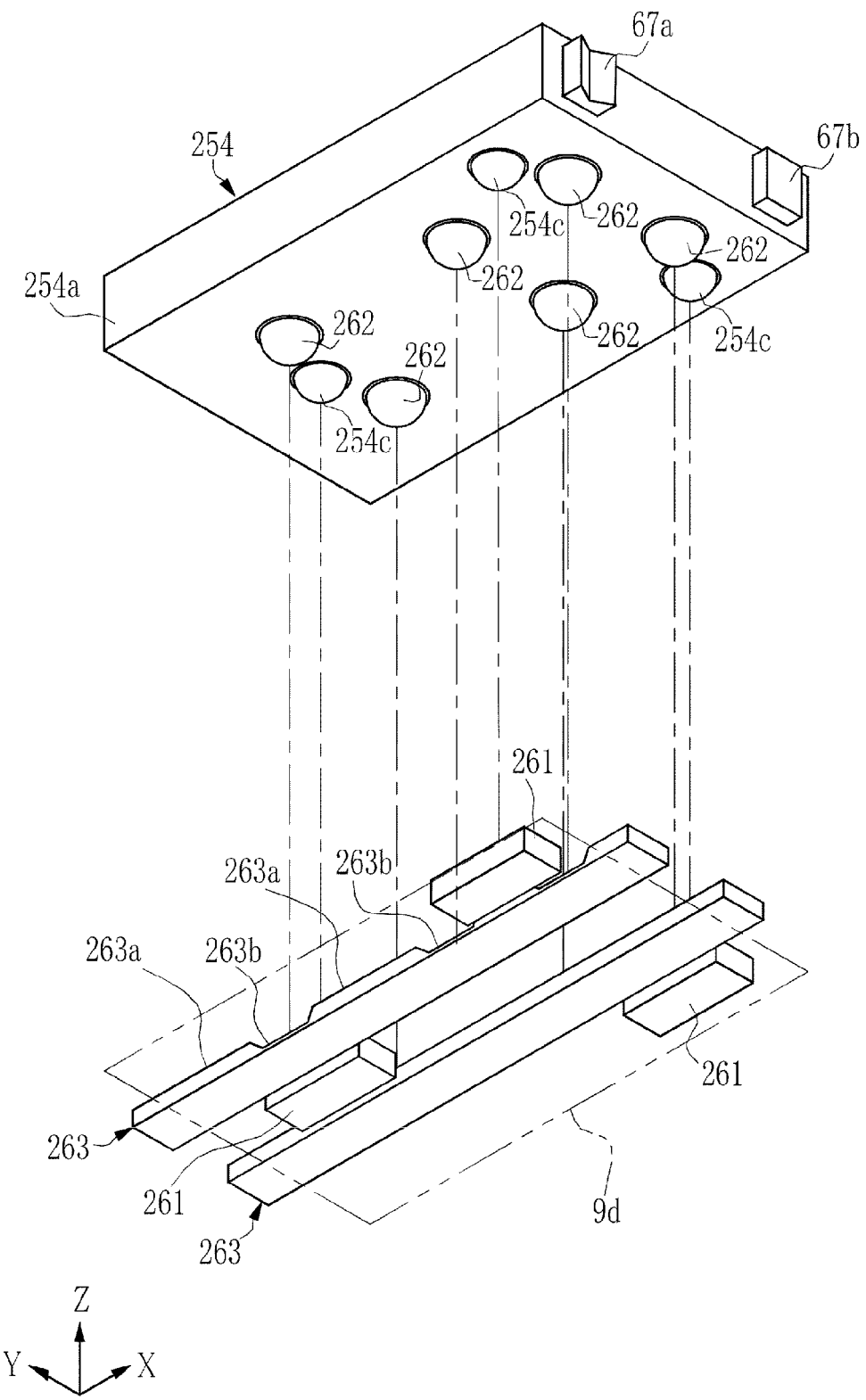
FIG. 15A is an exploded perspective view of part of the configuration of an attachment mechanism of the optical unit according to the second embodiment when viewed obliquely from below.
Figure 15B:
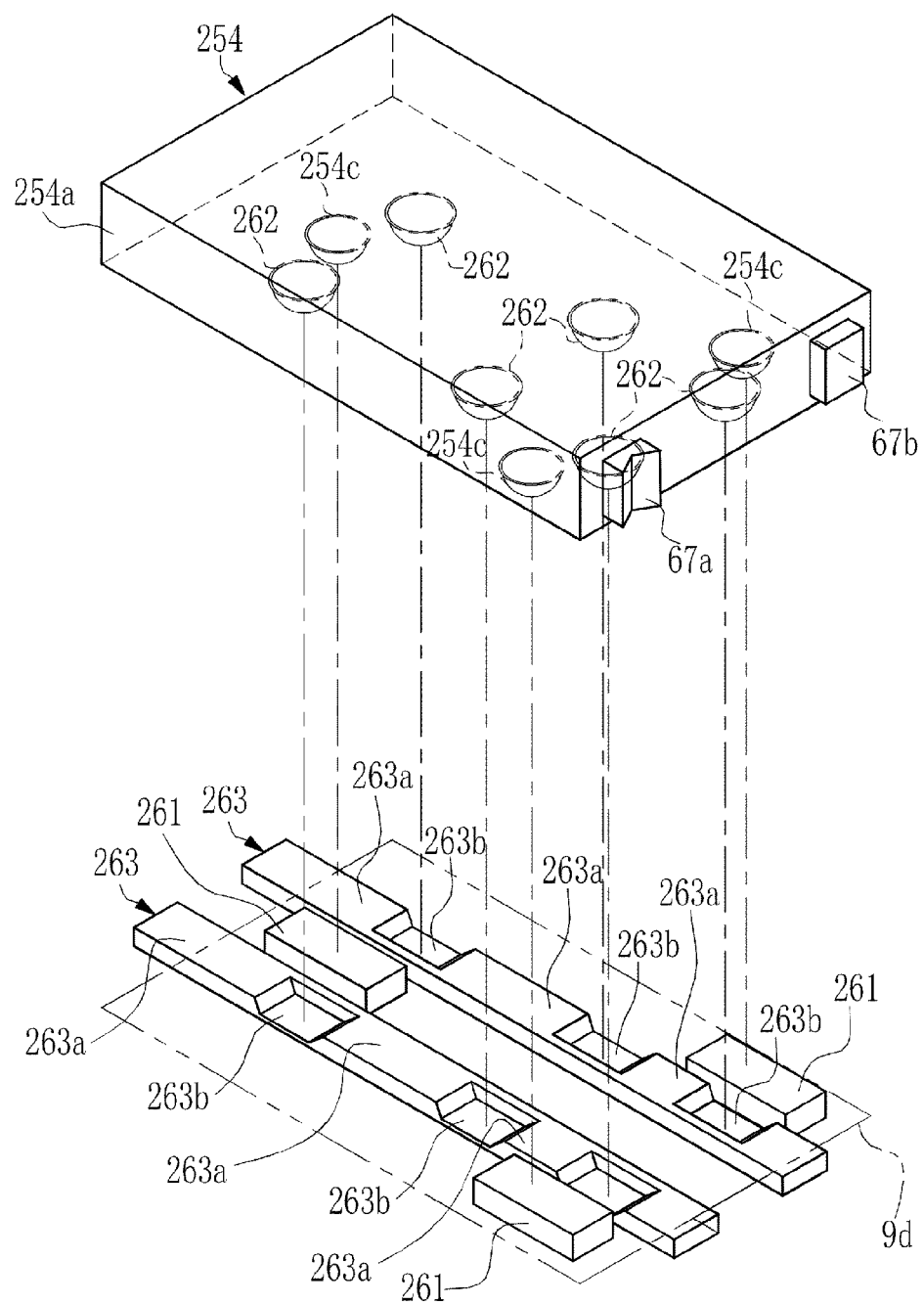
FIG. 15B is an exploded perspective view of part of the configuration in FIG. 15A when viewed obliquely from above.

3.1 Description of Attachment Mechanism of Laser Beam Introduction Optical System of the Second Embodiment FIGS. 14A to 14C, 15A, and 15B are each an explanatory diagram of the attachment mechanism 10B configured to attach a laser beam introduction optical system of the second embodiment to the chamber reference member 9. FIGS. 14A to 14C are each an explanatory diagram of the attachment mechanism 10B and an optical unit 256 positioned and fixed to a predetermined position of the chamber reference member 9 by the attachment mechanism 10B, and correspond to FIGS. 8A to 8C of the first embodiment. FIGS. 15A and 15B correspond to FIGS. 9A and 9B of the second embodiment.

An attachment mount 254 of the second embodiment includes a body part 254a and a ball caster 254c. The attachment mechanism 10B of the second embodiment is different from the attachment mechanism 10A of the first embodiment mainly in the configuration of a movement mechanism.

3.1.1 Height Positioning Mechanism

As illustrated in FIGS. 14A to 14C and 15A, the bottom surface 9d is provided with a mount 261 included in a height positioning mechanism. Similarly to the first embodiment, the ball caster 254c of the attachment mount 254 is placed on the mount 261. As illustrated in FIGS. 14C and 15A, the numbers of and disposition of the ball casters 254c and the mounts 261 are same as those of the first embodiment. As illustrated in FIGS. 14A to 14C, at the installation position where the ball casters 254c are placed on the mounts 261, the upper surface of the body part 254a of the attachment mount 254 is positioned to the height T1 from the bottom surface 9d. Accordingly, the height of the laser beam introduction optical system is adjusted. The mount 261 is a flat plate same as that of the first embodiment and is not provided with a slope as in the comparative example.

3.1.2 Movement Mechanism

As illustrated in FIGS. 14A to 14C, 15A, and 15B, the movement mechanism includes ball casters 262 and rails 263. In the second embodiment, the ball casters 262 are used as components of the movement mechanism in place of the wheels 162 of the first embodiment. Similarly to the ball casters 254c included in the height positioning mechanism, the ball casters 262 are disposed on the lower surface of the body part 254a.

As illustrated in FIGS. 14C, 15A, and 15B, the six ball casters 262 are provided, and the body part 254a includes two columns of the three ball casters 262 arrayed in the X direction. The two rails 263 are disposed on the bottom surface 9d in a manner corresponding to each column of the ball casters 262. Each rail 263 is provided with a guide surface 263a and a retraction part 263b. The ball casters 262 ground on the guide surface 263a and travel on the guide surface 263a while rotating.

In the second embodiment, similarly to the first embodiment, the number and disposition interval of the retraction parts 263b of each rail 263 correspond to the number and disposition interval of the ball casters 262. As illustrated in FIG. 14A, the ball casters 262 included in the movement mechanism are retracted from the guide surface 263a to the retraction parts 263b when the optical unit 256 reaches the installation position on the mounts 261. Accordingly, the guide surface 263a is separated from the ball casters 262, which ends the guide by the movement mechanism. Thus, when placed on the mounts 261, the optical unit 256 is positioned to the installation height T1 only with the thickness TH of the mounts 261 without interference of the rails 263 and the ball casters 262.

As illustrated in FIG. 14A, the height TR of the guide surface 263a of the rail 263 from the bottom surface 9d is equal to the height from the bottom surface 9d to the lower end of the ball caster 262 when the optical unit 256 is at the installation height T1. Thus, in the second embodiment, similarly to the first embodiment, the installation height T1 is equal to the guide height at which the optical unit 156 is guided in the X direction by the guide surfaces 263a of the rails 263.

Figure 16A:
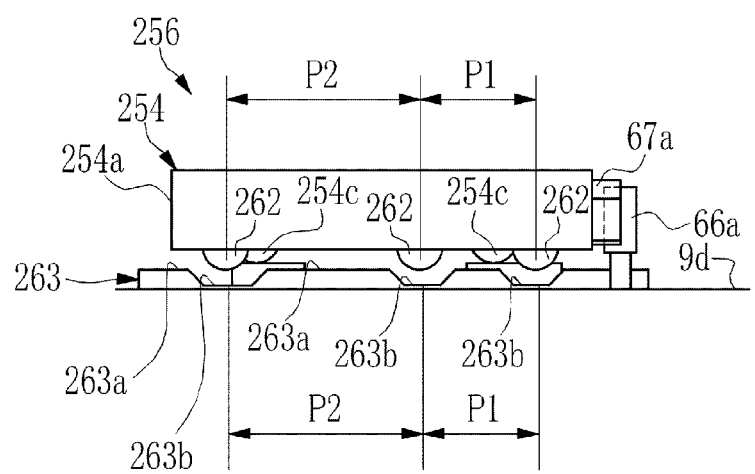
FIG. 16A is an explanatory diagram of the disposition pitch of a retraction part according to the second embodiment.
Figure 16B:
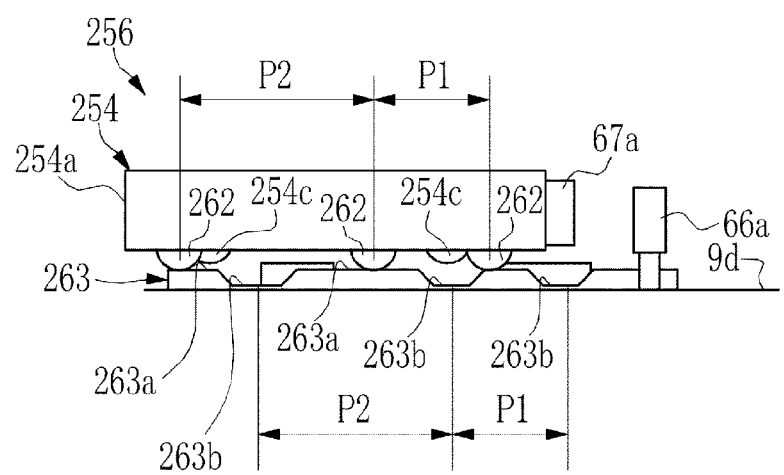
FIG. 16B is an explanatory diagram of the disposition pitch when the optical unit is in a state different from the state in FIG. 16A.

As illustrated in FIGS. 16A and 16B, similarly to the first embodiment, the disposition pitch of the three ball casters 262 has unequal intervals. Specifically, the pitch P1 between the first and second ball casters 262 on the front side is different from the pitch P2 between the second ball caster 262 and the third ball caster 262. The disposition pitch of the three retraction parts 263b of the rail 263 corresponds to the disposition pitch of the three ball casters 262.

Thus, as illustrated in FIG. 16B, in the second embodiment, similarly to the first embodiment, the three ball casters 262 do not simultaneously pass above the retraction parts 263b until the optical unit 256 reaches the installation position. Accordingly, a state in which the two ball casters 262 ground on the guide surface 263a at least while one of the ball casters 262 passes above the retraction part 263b is maintained.

3.1.3 Horizontal Direction Positioning Mechanism

As illustrated in FIGS. 14C, 15A, and 15B, similarly to the first embodiment, a horizontal direction positioning mechanism of the second embodiment includes the abutment pins 66a and 66b, the V-shaped block 67a, the flat block 67b, and the pressing unit 68. The configuration and function of each component of the horizontal direction positioning mechanism of the second embodiment are same as those of the first embodiment.

3.1.4 Operation

The operation of the second embodiment is same as that of the first embodiment described with reference to FIGS. 7A to 7F. In the second embodiment as well, the truck 76 is used at attachment of the optical unit 256. The installation height T1 of the optical unit 256 is equal to the guide height at which the optical unit 256 is guided in the X direction by the guide surface 263a of the rail 263. Thus, impact attributable to the mounts 261 can be reduced at attachment of the optical unit 256, thereby preventing alignment shift of the laser beam introduction optical system.

Figure 17:
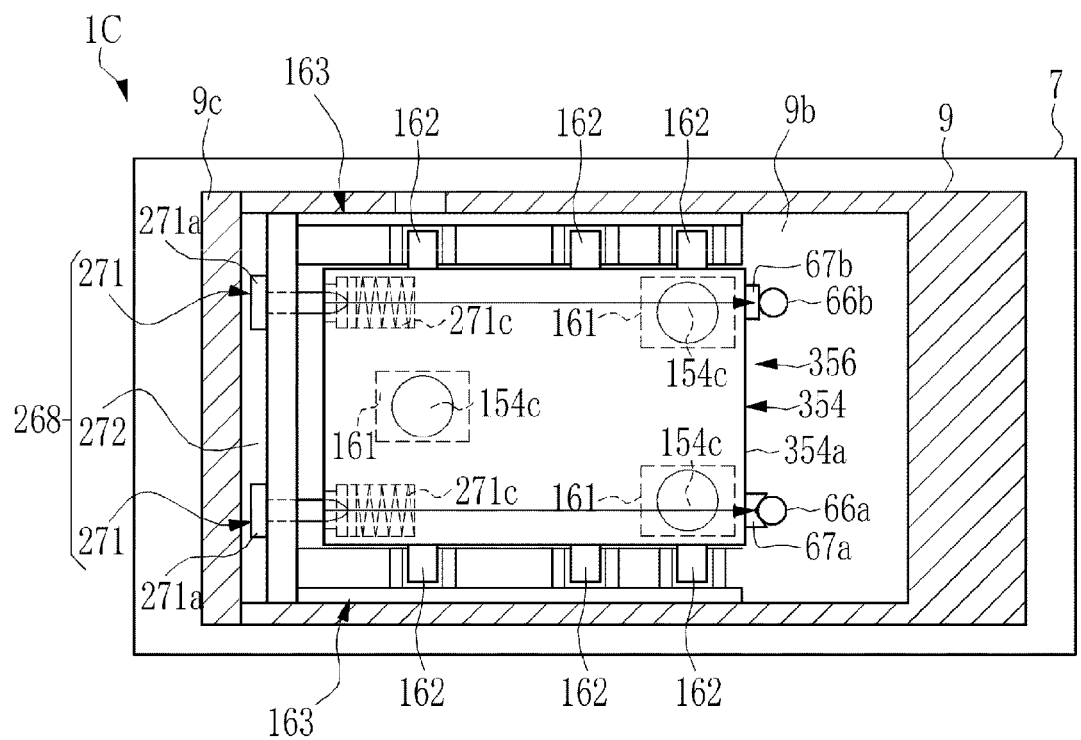
FIG. 17 is a plan view of a pressing unit according to a third embodiment.
Figure 18:
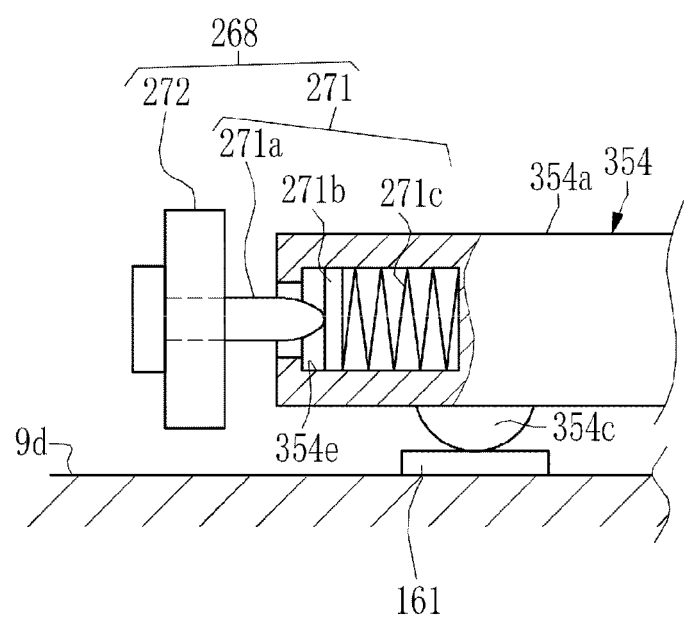
FIG. 18 is an explanatory diagram of a pressing portion according to the third embodiment.

4. Third Embodiment 4.1 Configuration of Horizontal Direction Positioning Mechanism FIGS. 17 and 18 are each an explanatory diagram of an attachment mechanism of an EUV light generation apparatus 1C of a third embodiment. The third embodiment has a basic configuration same as that of the first embodiment, and has difference mainly in the configuration of a pressing unit 268 included in the horizontal direction positioning mechanism. The following description is mainly made on the difference.

As illustrated in FIG. 17, the pressing unit 268 includes two pressing portions 271 and an attachment base 272. Similarly to the first embodiment, both ends of the attachment base 272 are fixed to the rear ends of the rails 163. An optical unit 356 includes an attachment mount 354.

As illustrated in FIG. 18, the pressing portions 271 include a pressing bolt 271a, a pressing plate 271b, and a coil spring 271c. A housing unit 354e in which the coil spring 271c is housed is provided at a rear end part of a body part 354a of the attachment mount 354. In the housing unit 354e, the pressing plate 271b is disposed on the back side of the coil spring 271c.

The bolt 271a is attached to a tap hole formed at the attachment base 272. When the bolt 271a is rotated relative to the attachment base 272, the amount of protrusion of a leading end of a bolt shaft changes through screw feeding. The shaft of the bolt 271a penetrates through the attachment base 272, and the leading end of the shaft contacts the pressing plate 271b. When the bolt 271a presses the pressing plate 271b, the coil spring 271c elastically deforms in the direction of contraction. Pushing force due to the elastic deformation of the coil spring 271c acts as pressing force that presses the attachment mount 354 against the abutment pins 66a and 66b. The pressing force is adjusted to a target value by adjusting the protrusion amount of the bolt 271a.

As illustrated in FIG. 17, the two pressing portions 271 are provided. The pressing portions 271 are disposed at positions facing, in the X direction, the respective abutment pins 66a and 66b that contact the V-shaped block 67a and the flat block 67b on the front surface of the body part 354a. Specifically, the pressing portions 271 in the width direction (Y direction) are located on straight lines extending in the X direction from the respective abutment pins 66a and 66b.

4.2 Operation

In the housing space 9b, after the optical unit 356 is guided to the installation position on the mounts 161 and the height thereof is adjusted, positioning in the horizontal direction is performed. First, the attachment base 272 is fixed to the rear ends of the rails 163. Subsequently, the two bolts 271a are attached to the attachment base 272. Thereafter, the bolts 271a are fastened so that pressing force of the attachment mount 354 against the abutment pins 66a and 66b is adjusted to target pressing force. The two bolts 271a may be attached to the attachment base 272 in advance while the attachment mount 354 does not generate the target pressing force.

Figure 19A:
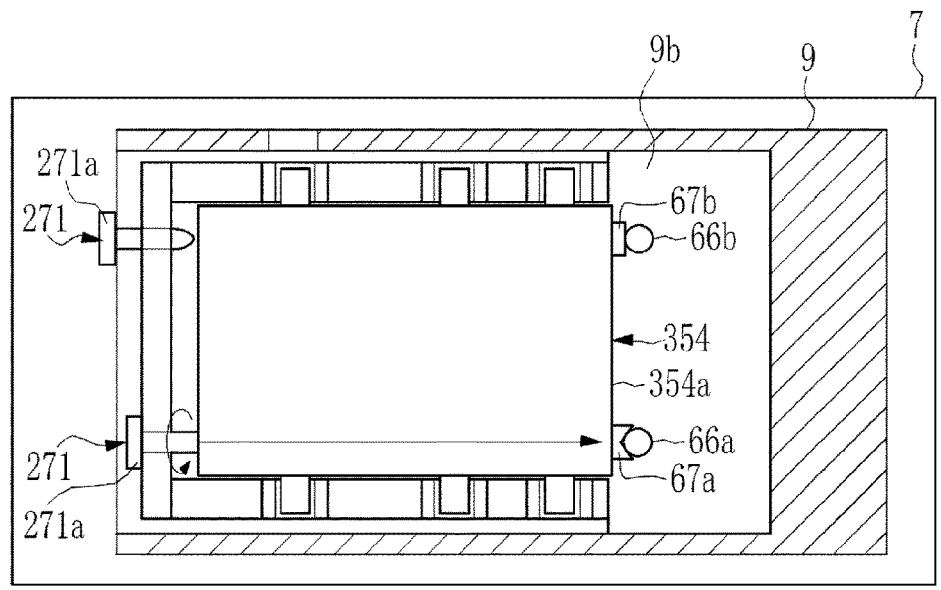
FIG. 19A is a first explanatory diagram illustrating the procedure of attaching the pressing unit according to the third embodiment.

As illustrated in FIG. 19A, at the fastening of the bolts 271a, first, the bolt 271a facing the V-shaped block 67a is fastened. Accordingly, the abutment pin 66a enters up to an appropriate position in the V groove of the V-shaped block 67a. However, the pressing force on the attachment mount 354 is disproportionate when only one of the bolts 271a is fastened, and thus, for example, the attachment mount 354 is rotated anticlockwise about the center of the abutment pin 66a in some cases.

Figure 19B:
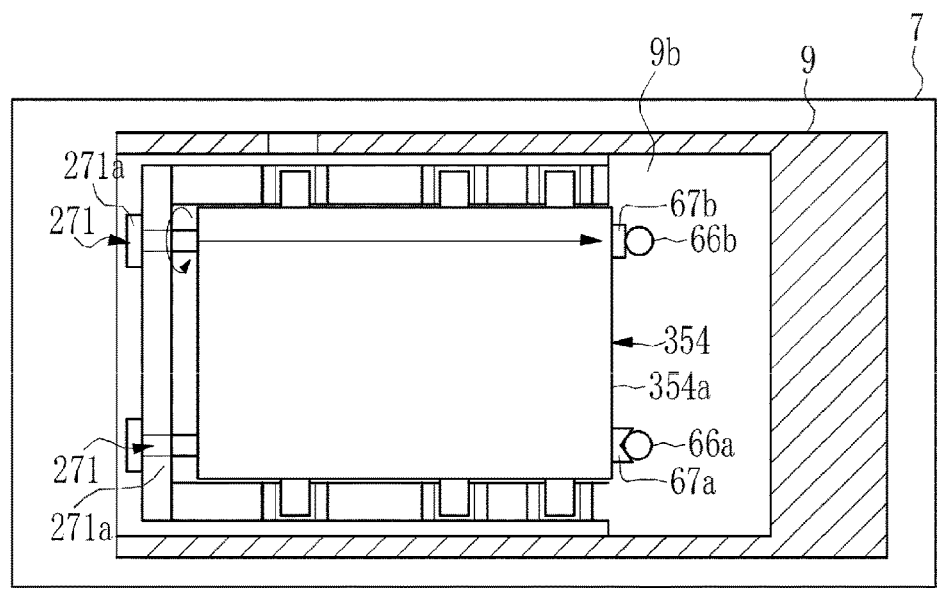
FIG. 19B is a second explanatory diagram of illustrating the attachment procedure illustrated in FIG. 19A.

Thereafter, the bolt 271a facing the flat block 67b is fastened as illustrated in FIG. 19B. Since the abutment pin 66a is fitted to the appropriate position in the V groove of the V-shaped block 67a, the flat block 67b can be pressed to rotate the attachment mount 354 clockwise and pressed against the abutment pin 66b. Positioning in the horizontal direction can be accurately performed by appropriately managing the pressing force of the pressing portions 271.

In this manner, in the third embodiment, the two pressing portions 271 are disposed at positions facing the two abutment pins 66a and 66b in the X direction. The pressing portion 271 facing the abutment pin 66a that contacts the V-shaped block 67a is first pressed, and thereafter, the other pressing portion 271 is pressed. Thus, positioning in the horizontal direction can be appropriately performed as compared to the first embodiment and the comparative example in which only one pressing portion is provided at the center.

This is because of the following reason. As illustrated in FIG. 4C or the like, when only one pressing portion 71 is provided at the center, pressing force is applied to the two abutment pins 66a and 66b from one pressing position. In this case, pressing force on each of the two abutment pins 66a and 66b is component force of pressing force exerted from the one pressing position. In addition, the posture of the optical unit 356 at the installation position varies, and for example, the optical unit 356 guided to the installation position by the movement mechanism is slightly tilted in the horizontal plane.

When the optical unit 356 is tilted, the component force of pressing force exerted from one pressing position is not equal between the abutment pins 66a and 66b, and thus the optical unit 356 cannot be positioned to an appropriate position in some cases.

In the following, description is provided, for example, on a case in which the posture of the optical unit 356 is tilted, the flat block 67b contacts the abutment pin 66b, and the abutment pin 66a is not fitted to an appropriate position in the V groove of the V-shaped block 67a. In such a case, when the friction of the flat block 67b is large, corrective force in the Y direction is needed to fit the abutment pin 66a to an appropriate position of the V-shaped block 67a. However, when the component force of pressing force is not equal, this corrective force does not appropriately act in some cases. When the corrective force does not appropriately act in this manner, the abutment pin 66a is not fitted to an appropriate position in the V groove, and thus appropriate positioning of the optical unit 356 in the horizontal direction is not achieved in some cases.

In the third embodiment, pressing force from the two pressing portions 271 acts on the two abutment pins 66a and 66b straightly in the X direction parallel to the abutment direction. Then, pressing is first performed by the pressing portion 271 corresponding to the abutment pin 66a that contacts the V-shaped block 67a. When the posture of the optical unit 356 is tilted, the pressing force from the pressing portions 271 straightly acts on the V-shaped block 67a and the abutment pin 66a, thereby fitting the abutment pin 66a to an appropriate position in the V groove. Accordingly, the posture of the optical unit 356 in the horizontal direction (the X and Y directions) is appropriately positioned.

The pressing portions 271 include the coil spring 271c in place of the disc spring 71c. Thus, the work time of positioning of the optical unit 356 is shortened, and position reproducibility is improved. This is because of the following reason.

The disc spring 71c has a spring constant extremely larger than that of the coil spring 271c. The spring constant is the change amount of elastic force (reaction force) per unit displacement amount, and thus elastic force largely varies with small displacement when the spring constant is large. Thus, the protrusion amount of the pressing portion 71 needs to be precisely managed to set the target pressing force, and the work time of adjusting pressing force increases in some cases.

The disc spring 71c has a low resistance against repetitive deformation, and plastic deformation remains, and thus the management of pressing force is relatively difficult. Thus, when the optical unit 356 is repeatedly attached and removed, pressing force varies at each attachment, and thus it is difficult to guarantee the position reproducibility of the optical unit 356 in some cases. When it is difficult to guarantee the position reproducibility, the attachment positions of the beam splitter 52 and the high reflectance mirror 53 need to be finely adjusted after the optical unit 356 is attached, which leads to extra work.

In the third embodiment, the coil spring 271c having a spring constant smaller than that of the disc spring 71c is used, and thus it is unnecessary to rigorously manage the protrusion amount of each bolt 271a. Thus, the work time of adjusting pressing force can be reduced. In addition, it is easier for the coil spring 271c to have allowance in resistance against plastic deformation than the disc spring 71c, which leads to improvement of the position reproducibility when the optical unit 356 is repeatedly attached and removed.

In the third embodiment, the housing unit 354e in which the coil spring 271c is housed is provided in the body part 354a of the attachment mount 354. Thus, it is possible to use the coil spring 271c having a size larger than that of the disc spring 71c even when the installation space of the housing space 9b is small.

The above description is intended to provide not restriction but examples. Thus, the skilled person in the art would clearly understand that the embodiments of the present disclosure may be changed without departing from the scope of the appended claims.

The terms used throughout the specification and the scope of the appended claims should be interpreted as "non-limiting". For example, the term "comprising" or "comprised" should be interpreted as "not limited to what has been described as being comprised". The term "having" should be interpreted as "not limited to what has been described as having". Further, the modifier "a/an" described in the specification and the scope of the appended claims should be interpreted to mean "at least one" or "one or more".

What is claimed is:

1. An extreme ultraviolet light generation apparatus comprising:
   A. a chamber in which extreme ultraviolet light is generated by a target substance being irradiated with a laser beam to generate plasma from the target substance;
   B. an optical unit including a laser beam introduction optical system for introducing the laser beam into the chamber;
   C. a chamber reference member supporting the chamber and including a housing space in which the optical unit is housed;
   D. a height positioning mechanism configured to position, at a predetermined installation position in the housing space, the optical unit to a predetermined installation height while contacting a first part of the optical unit; and
   E. a movement mechanism configured to linearly move the optical unit in the horizontal direction in the housing space while keeping the optical unit at a guide height, and including a guide member provided with a guide surface that guides the optical unit to the installation position while contacting a second part of the optical unit, and a retraction part that is provided to the guide member and to which the second part is retracted from the guide surface when the optical unit reaches the installation position, the guide height of the optical unit while being guided to move toward the installation position by the guide surface being substantially equal to the installation height.

2. The extreme ultraviolet light generation apparatus according to claim 1, wherein the second part is a rotational body that rotates while contacting the guide surface.

3. The extreme ultraviolet light generation apparatus according to claim 2, wherein the guide member is a rail extending in a moving direction in which the optical unit is guided.

4. The extreme ultraviolet light generation apparatus according to claim 3, wherein
   three or more of the rotational bodies are arrayed in the moving direction,
   disposition pitch of the rotational bodies has unequal intervals, and
   a number of the retraction parts is equal to a number of the rotational bodies, and the retraction parts are disposed at positions facing the respective rotational bodies of the optical unit at the installation position.

5. The extreme ultraviolet light generation apparatus according to claim 3, wherein the optical unit includes an attachment mount to which the laser beam introduction optical system is fixed.

6. The extreme ultraviolet light generation apparatus according to claim 5, wherein
   the rotational body is disposed on both sides of the attachment mount in a width direction orthogonal to the moving direction, and
   the rail is disposed on a sidewall of the housing space.

7. The extreme ultraviolet light generation apparatus according to claim 5, wherein
   the rotational body is disposed on a lower surface of the attachment mount, and
   the rail is disposed on a bottom surface of the housing space.

8. The extreme ultraviolet light generation apparatus according to claim 5, wherein
   the first part is a caster provided to the attachment mount, and
   the height positioning mechanism includes a mount on which the caster is placed.

9. The extreme ultraviolet light generation apparatus according to claim 5, further comprising:
   F: a horizontal direction positioning mechanism configured to perform, at the installation position, positioning of the optical unit in an X direction that is the moving direction of the optical unit guided by the movement mechanism, and in a Y direction that is orthogonal to the X direction and is a width direction of the optical unit.

10. The extreme ultraviolet light generation apparatus according to claim 9, wherein
    the horizontal direction positioning mechanism includes:
    an abutment pin disposed in the housing space and configured to regulate movement of the attachment mount in the X direction when contacting a first end part of the attachment mount; and
    a pressing portion configured to press the attachment mount against the abutment pin from a second end part opposite to the first end part in the X direction.

11. The extreme ultraviolet light generation apparatus according to claim 10, wherein
    two of the abutment pins are disposed at an interval in the Y direction, and
    the attachment mount includes two abutment blocks that contact the respective two abutment pins.

12. The extreme ultraviolet light generation apparatus according to claim 11, wherein
    the two abutment pins each have a circular horizontal sectional shape,
    one of the abutment blocks is a V-shaped block having a V-groove horizontal sectional shape at a contact part that contacts the corresponding abutment pin, and
    the other of the abutment blocks is a flat block having a plane shape at a contact part that contacts the corresponding abutment pin.

13. The extreme ultraviolet light generation apparatus according to claim 12, wherein two of the pressing portions are disposed at positions facing the respective two abutment pins in the X direction.

14. The extreme ultraviolet light generation apparatus according to claim 10, wherein the pressing portion includes a coil spring.

15. The extreme ultraviolet light generation apparatus according to claim 14, wherein the attachment mount is provided with a housing unit in which the coil spring is housed.

16. The extreme ultraviolet light generation apparatus according to claim 3, wherein the retraction part is a bottomed recess formed at the rail.

17. The extreme ultraviolet light generation apparatus according to claim 3, wherein the retraction part is a bottomless gap formed at the rail.

* * * * *